(12) United States Patent
Simsek-Ege

(10) Patent No.: US 12,396,164 B2
(45) Date of Patent: Aug. 19, 2025

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 430 days.

(21) Appl. No.: 17/930,388

(22) Filed: Sep. 7, 2022

(65) Prior Publication Data

US 2024/0081049 A1    Mar. 7, 2024

(51) Int. Cl.
  *H10B 12/00*    (2023.01)
  *G11C 11/408*   (2006.01)
  *G11C 11/4091*  (2006.01)

(52) U.S. Cl.
  CPC .......... *H10B 12/50* (2023.02); *G11C 11/4085* (2013.01); *G11C 11/4091* (2013.01)

(58) Field of Classification Search
  CPC ..... H01L 24/08; H01L 24/80; H01L 25/0657; H10B 12/02; H10B 12/30; H10B 12/50; H10B 12/482; H10B 12/488; G11C 11/4085; G11C 11/4091
  See application file for complete search history.

(56) References Cited

U.S. PATENT DOCUMENTS

| | | | |
|---|---|---|---|
| 2020/0328181 A1* | 10/2020 | Liu | H01L 24/08 |
| 2023/0005816 A1 | 1/2023 | Simsek-Ege | |
| 2023/0005854 A1 | 1/2023 | Simsek-Ege et al. | |
| 2023/0005855 A1 | 1/2023 | Simsek-Ege | |
| 2023/0005903 A1 | 1/2023 | Simsek-Ege et al. | |
| 2023/0005932 A1 | 1/2023 | Simsek-Ege et al. | |
| 2023/0060512 A1 | 3/2023 | Simsek-Ege | |
| 2023/0207505 A1* | 6/2023 | Simsek-Ege | G11C 11/4085 257/296 |
| 2023/0301053 A1* | 9/2023 | He | G11C 11/4085 257/296 |

OTHER PUBLICATIONS

He et al., "Microelectronic Devices Including Control Logic Circuitry Overlying Memory Arrays, and Related Memory Devices and Electronic Systems", filed Aug. 29, 2022, U.S. Appl. No. 17/898,150, 47 pages.

(Continued)

*Primary Examiner* — Brook Kebede
(74) *Attorney, Agent, or Firm* — TraskBritt

(57) ABSTRACT

A microelectronic device is disclosed including a control logic structure that includes sense amplifiers clustered around sense amplifier exit regions; an upper memory array structure underlying the control logic structure and that includes memory cells coupled to some of the sense amplifiers of the control logic structure by way of routing extending through the sense amplifier exit regions; and a lower memory array structure underlying the upper memory array structure and that includes additional memory cells coupled to some other of the sense amplifiers of the control logic structure by way of additional routing extending through the sense amplifier exit regions.

25 Claims, 11 Drawing Sheets

(56) References Cited

OTHER PUBLICATIONS

He et al., "Microelectronic Devices Including Control Logic Circuitry Overlying Memory Arrays, and Related Memory Devices and Electronic Systems", filed Mar. 18, 2022, U.S. Appl. No. 17/698,558, 44 pages.

Simsek-EGE et al., Methods of Forming Microelectronic Devices, and Related Microelectronic Devices and Electronic Systems, U.S. Appl. No. 17/364,377, filed Jun. 30, 2021, 109 pages.

Simsek-EGE, Methods of Forming Microelectronic Devices, and Related Microelectronic Devices and Electronic Systems, U.S. Appl. No. 17/364,379, filed Jun. 30, 2021, 90 pages.

\* cited by examiner

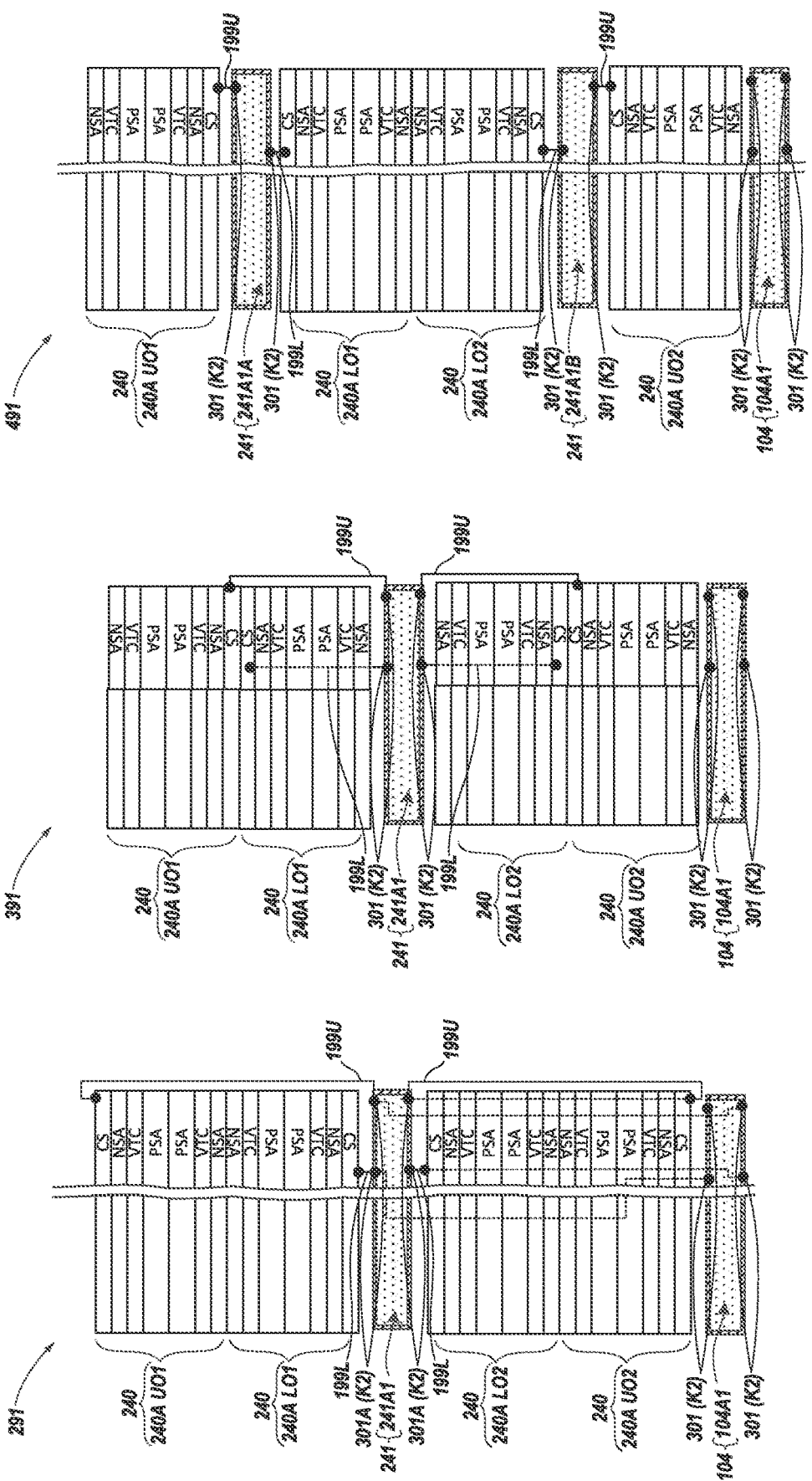

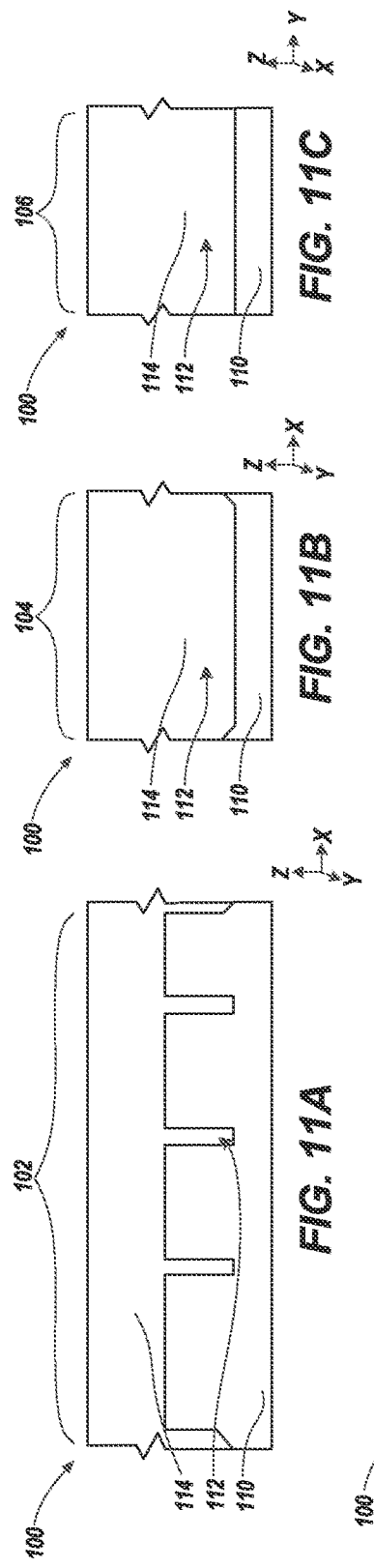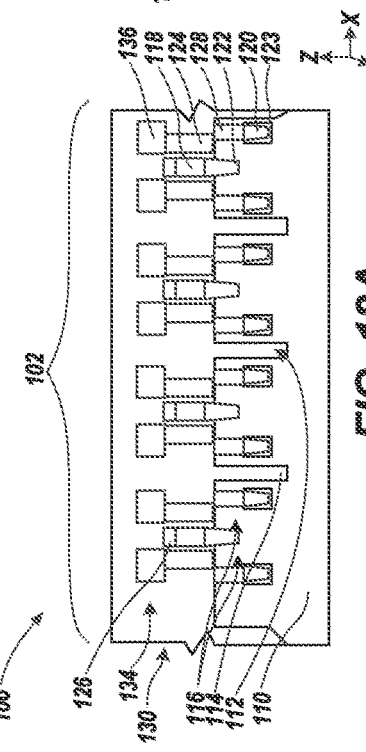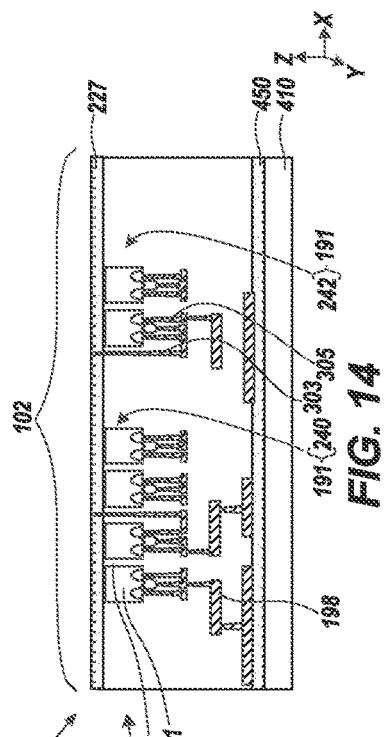

METHODS OF FORMING MICROELECTRONIC DEVICES, AND RELATED MICROELECTRONIC DEVICES AND ELECTRONIC SYSTEMS

TECHNICAL FIELD

The disclosure, in various embodiments, relates generally to the field of microelectronic device design. More specifically, the disclosure relates microelectronic devices including control logic circuitry overlying memory arrays, and to related memory devices, and electronic systems.

BACKGROUND

Microelectronic devices often have complex signal routing that may affect performance. One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of structures (e.g., vertical routing structures, such as conductive contacts; horizontal routing structures, such as traces). Unfortunately, three-dimensional (3D) memory device (e.g., 3D DRAM device) architectures can require complex and congested routing designs to electrically connect DRAM cells to control logic circuitry, such as sub-word line drivers (SWD) circuitry and sense amplifiers (SA) circuitry.

BRIEF DESCRIPTION OF THE DRAWINGS

FIG. 5 is a simplified top plan view of portions of a sense amplifier device assembly in the control logic circuitry depicted in FIGS. 1, 3, and 4.

FIG. 6 is a simplified top plan view of portions of a sense amplifier device assembly in the control logic circuitry depicted in FIGS. 1, 3, and 4.

FIG. 7 is a simplified top plan view of portions of a sense amplifier assembly in control logic circuitry depicted in FIGS. 1, 3, and 4.

FIGS. 11A through 11C are simplified, partial longitudinal cross-sectional views of an array region (FIG. 11A), a digit line exit region (FIG. 11B), and a word line exit region (FIG. 11C), and a socket region (FIG. 2D) of the microelectronic device structure shown in FIG. 1 at the processing stage assembling a memory array device.

FIGS. 12A through 12C are simplified, partial longitudinal cross-sectional views of the array region (FIG. 12A), the digit line exit region (FIG. 12B), and the word line exit region (FIG. 12C) shown in FIGS. 11A through 11C, respectively, at another processing stage of the method of forming the microelectronic device following the processing stage of FIGS. 11A through 11C.

FIG. 13 illustrates a simplified, partial longitudinal cross-sectional view of the array region (FIG. 12A) at a processing stage of the method of forming the microelectronic device following the processing stage of FIGS. 12A through 12C, in accordance with embodiments of the disclosure. FIG. 14 illustrates a simplified, partial longitudinal cross-sectional view of the array region (FIG. 12A) at a processing stage of the method of forming the microelectronic device following the processing stage of FIGS. 12A through 12C, in accordance with additional embodiments of the disclosure.

DETAILED DESCRIPTION

Figure 1:
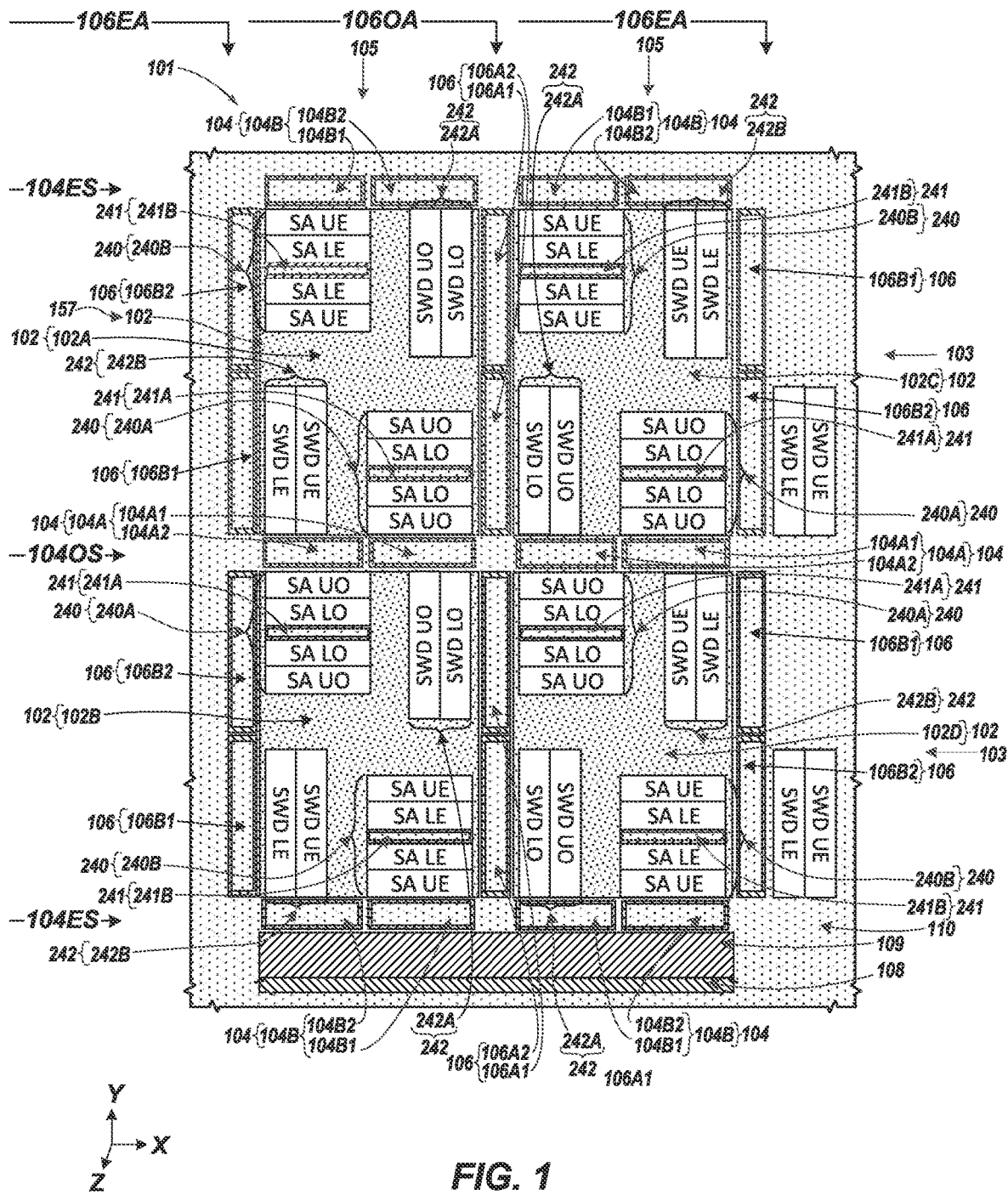
FIG. 1 is a simplified plan view of a microelectronic device, in accordance with an embodiment of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round or curved may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated device" where distinct integrated-circuit components are associated to produce the higher function such as that performed by an SoC, including a processor alone, a memory alone, a processor and a memory, or an integrated-circuit device including logic and memory.

As used herein, the term "substrate" means and includes a material (e.g., a base material) or construction upon which additional materials are formed. The substrate may be a semiconductor substrate. The substrate may be a base semiconductor material on a supporting structure, a metal electrode, or a semiconductor substrate having one or more materials, layers, structures, or regions formed thereon. The materials on the semiconductor substrate may include, but are not limited to, one or more of semiconductor materials, insulating materials, and conductive materials. The substrate may be a conventional silicon substrate or other bulk substrate comprising a layer of semiconductor material. As used herein, the term "bulk substrate" means and includes not only silicon wafers, but also silicon-on-insulator ("SOI") substrates. The "bulk substrate" may be a SOI substrate such as a silicon-on-sapphire ("SOS") substrate. The "bulk substrate" may be a SOI substrate such as a silicon-on-glass ("SOG") substrate. The "bulk substrate" may include epitaxial layers of silicon on a base semiconductor foundation. The "bulk substrate" may include other semiconductor and/or optoelectronic materials. The semiconductor and/or optoelectronic materials may, for example, include one or more of silicon-germanium containing materials, germanium-containing materials, silicon-carbide containing materials, gallium arsenide-containing materials, gallium nitride-containing materials, and indium phosphide-containing materials. The substrate may be doped or undoped.

As used herein, the term "mounting substrate" means and includes structures that are configured to accept an integrated-circuit device. The mounting substrate may be a silicon bridge that is configured to connect more than on integrated-circuit device. The mounting substrate may be a package board that directly contacts an integrated circuit device such as a bare die containing a central-processing unit. The package board may be mounted on a printed wiring board (PWB). The mounting substrate may be a printed wiring board onto which at least one integrated circuit device and/or package board are mounted. The mounting substrate may include a disaggregated device. Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 is a simplified top plan of portions of a microelectronic device 101. The microelectronic device 101 includes an upper memory array device assembly 157 (e.g., FIGS. 2A and 4) that includes array regions 102 (and array subregions, e.g., a first array subregion 102A), digit line exit regions 104, word line exit regions 106, sense amplifier (SA) clusters 240, sense amplifier exit regions 241, and paired sub-word line drivers (SWD) 242, among other structures. The microelectronic device 101 may also include control logic circuitry regions 109, as well as routing arrangements to different control logic devices (e.g., corresponding to the control logic circuitry 191 (e.g., FIG. 4)) within the different control logic sections, in accordance with embodiments of the disclosure. The array subregions 102, the digit line exit regions 104, the word line exit regions 106, the socket regions 108, sense amplifier clusters 240, the sense amplifier exit regions 241, electrical routing from the array subregions 102 to the sense amplifier clusters 240, the paired sub-word line drivers 242, and the control logic circuitry regions 109, are each described in further detail below. The microelectronic device 101 as illustrated may also include a first base semiconductor structure 110 that may include semiconductor material 111 and that may be associated with dielectric material 115 (e.g., FIG. 4) such as trench isolation material 113 (e.g., FIG. 4) that may be part of the upper memory array device assembly 157 (e.g., FIGS. 2A and 4).

With continued reference to FIG. 1, the digit line exit regions 104 are also referred to as "digit line contact socket regions" that are interposed between pairs of the array subregions 102 horizontally neighboring one another in a first horizontal direction (e.g., the Y-direction). The digit line exit regions 104 are further defined as odd digit line exit regions 104A and even digit line exit regions 104B. The odd digit line exit regions 104A are further defined as first odd digit line exit regions 104A1 and second odd digit line exit regions 104A2. The even digit line exit regions 104B are further defined as first even digit line exit regions 104B1 and second even digit line exit regions 104B2.

The word line exit regions 106 are also referred to as "word line contact socket regions" that are interposed between additional pairs of the array subregions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array subregions 102 in one or more of the first horizontal direction and the second horizontal direction. The word line exit regions 106 are further defined as odd word line exit regions 106A and even word line exit regions 106B. The odd word line exit regions 106A are further defined as first odd word line exit regions 106A1 and second odd word line exit regions 106A2. The even word line exit regions 106B are further defined as first even word line exit regions 106B1 and second even word line exit regions 106B2. The array subregions 102 are configured among digit line exit regions 104 and word line exit regions 106, that may be characterized as digit line exit region odd streets 104OS and digit line exit region even streets 104ES, where odd digit line exit regions 104A are arranged in continuous digit line exit region odd streets 104OS, and where even digit line exit regions 104B are arranged in continuous digit line exit region even streets 104ES. The word line exit regions 106 may be referred to as word line exit region odd avenues 106OA and word line exit region even avenues 106EA, where, e.g., odd word line exit regions 106A are arranged in continuous word line exit region odd avenues 106OA, and even word line exit regions 106B are arranged in continuous word line exit region even avenues 106EA.

Figure 4:
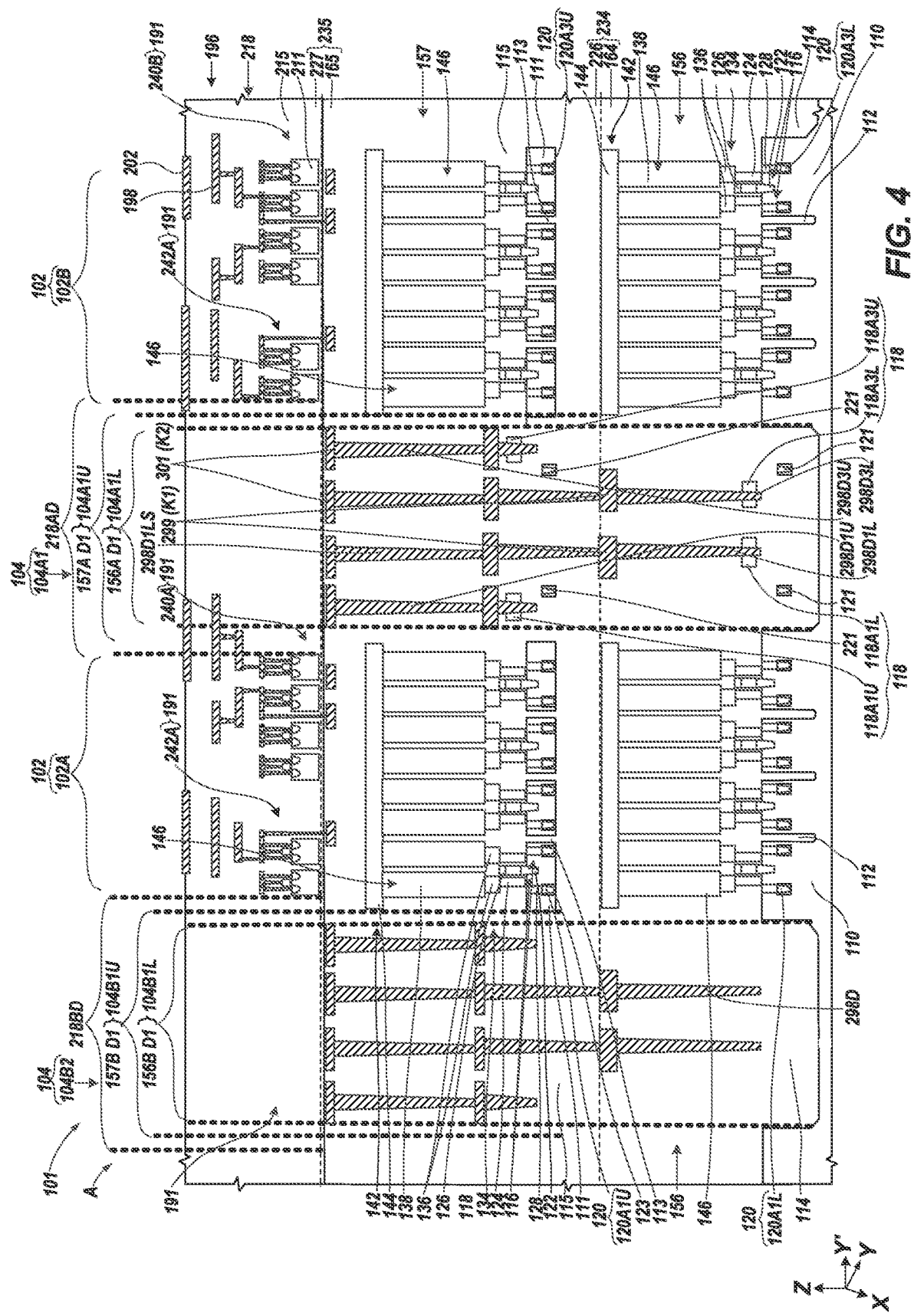
FIG. 4 is a simplified, partial longitudinal cross sectional elevation view of portions of the microelectronic device depicted in FIGS. 1, 2A, 2B, and 3.

The array subregions 102 (also referred to as tiles 102) of the microelectronic device 101 may comprise horizontal areas of the microelectronic device 101 configured and positioned to have arrays of memory cells (e.g., arrays of DRAM cells) within horizontal boundaries thereof, as described in further detail below. In addition, the array subregions 102 may also be configured and positioned to have desirable arrangements of control logic devices within horizontal boundaries thereof, as also described in further detail below. The control logic devices may include the sense amplifiers 240 and the sub-word line drivers 242, among other circuitry. The control logic devices are within the horizontal boundaries of the array subregions 102 and may be vertically offset (e.g., in the Z-direction) from the memory cells within the horizontal boundaries of the array regions 102, and the control logic circuitry may be located in the complementary metal-oxide-semiconductor (CMOS) device assembly 218 (FIG. 4).

The microelectronic device 101 may include a desired quantity of the array subregions 102. For clarity and ease of understanding of the drawings and related description, FIG. 1 depicts the microelectronic device 101 to include four (4) array subregions 102: a first array subregion 102A, a second array subregion 102B, a third array subregion 102C, and a fourth array subregion 102D. The array subregions 102 include respective first and second microelectronic device assemblies (DRAM array devices) 156 and 157 (e.g., FIGS. 2A, 2B and 4 also referred to as a lower memory array device assembly 156 and an upper memory array device assembly 157) as set forth herein. As shown in FIG. 1, the second array subregion 102B may horizontally neighbor the first array subregion 102A in the Y-direction, and may horizontally neighbor the fourth array subregion 102D in the X-direction; the third array subregion 102C may horizontally neighbor the first array subregion 102A in the X-direction, and may horizontally neighbor the fourth array subregion 102D in the Y-direction; and the fourth array subregion 102D may horizontally neighbor the third array subregion 102C in the Y-direction, and may horizontally neighboring the second array subregion 102B in the X-direction. In additional embodiments, the microelectronic device 101 includes a different number of array subregions 102. For example, the microelectronic device 101 may include greater than four (4) array subregions 102, such as greater than or equal to eight (8) array subregions 102, greater than or equal to sixteen (16) array subregions 102, greater than or equal to thirty-two (32) array subregions 102, greater than or equal to sixty-four (64) array subregions 102, greater than or equal to one hundred twenty eight (128) array subregions 102, greater than or equal to two hundred fifty six (256) array subregions 102, greater than or equal to five hundred twelve (512) array subregions 102, or greater than or equal to one thousand twenty-four (1024) array subregions 102.

In addition, the microelectronic device 101 may include a desired distribution of the array subregions 102. As shown in FIG. 1, in some embodiments, the microelectronic device 101 includes rows 103 of the array subregions 102 extending in the X-direction, and columns 105 of the array subregions 102 extending in the Y-direction. The rows 103 of the array subregions 102 may, for example, include a first row including the first array subregion 102A and the third array subregion 102C, and a second row including the second array subregion 102B and the fourth array subregion 102D. The columns 105 of the array subregions 102 may, for example, include a first column including the first array subregion 102A and the second array subregion 102B, and a second column including the third array subregion 102C and the fourth array subregion 102D.

With continued reference to FIG. 1, the sense amplifiers 240 and the sub-word line drivers 242 are positioned within horizontal boundaries of the array subregions 102, and in an "open architecture" configuration within the CMOS device assembly 218 that is positioned vertically (Z-direction) above the lower memory array device assembly 156 and the upper memory array device assembly 157. Open architecture includes, e.g., coupling at least one of selected digit lines 118 (FIGS. 2A and 2B) and word lines 120 (FIGS. 2A and 2B) from adjacent array subregions 102 where, e.g., signals from digit lines 118 (e.g., FIG. 2A) and from word lines 120 (e.g., FIG. 2A) from neighboring array subregions 102 are processed within horizontal boundaries of a single array subregion, e.g., the first array subregion 102A in the control logic such as within the CMOS device assembly 218 (FIG. 4). For example between the first array subregion 102A and the second array subregion 102B, signals from odd digit lines 118A (e.g., FIG. 2A) may be received within odd digit line exit regions 104A, and may be directed to odd sense amplifier 240A circuit devices. Sense amplifiers 240 are arranged in clusters (e.g., groups) of odd sense amplifiers 204A and even sense amplifiers 240B. Sense amplifiers 240 are further arranged in clusters of upper odd sense amplifiers (SA UO) with and lower odd sense amplifiers (SA LO) 240A. These odd sense amplifiers 240A refer to sense amplifiers in the CMOS device assembly 218 (FIG. 4) that process data from upper odd digit lines 118AU (FIG. 2A) from the upper memory array device assembly 157 (FIG. 2A), and from lower odd digit lines 118AL (FIG. 2B) from the lower memory array device assembly 156 (FIG. 2B). Sense amplifiers 240 are further arranged in clusters of upper even sense amplifiers (SA UE) with lower even sense amplifiers (SA LE) 240B. These lower sense amplifiers 240 refer to sense amplifiers in the CMOS device assembly 218 (FIG. 4) that process data from digit lines 118 (FIG. 2B) from the lower memory array device assembly 156 (FIG. 2B). Further detail is set forth in FIG. 3 of upper and lower sense amplifiers 240 that includes, e.g., arranged clusters of odd sense amplifiers 240A and arranged clusters of even sense amplifiers 240B. Further detail of upper and lower sub-word line drivers includes, e.g., arranged pairs of upper odd sub-word line drivers 242A UO with lower odd sub-word line drivers 242A LO and arranged pairs of upper even sub-word line drivers 242B UE with even lower sub-word line drivers 242B as set forth in FIG. 3.

With reference to the first array subregion 102A in FIG. 1, electrical coupling to the sense amplifier clusters 240, includes sense amplifier exit regions 241 that may be centrally positioned among a cluster of sense amplifiers 240. For example a cluster of odd sense amplifiers 240A includes an odd sense amplifier exit region 241A that is centrally positioned among the odd sense amplifiers 240A. Further detail for odd sense amplifiers 240A and odd sense amplifier exit regions 241A, include upper odd sense amplifiers (SA UO) and lower odd sense amplifiers (SA LO). The lower odd sense amplifiers (SA LO) are paired centrally and adjacent across the odd sense amplifier exit region 241A, and the upper odd sense amplifiers (SA UO) are clustered peripherally adjacent the centrally paired lower odd sense amplifiers (SA LO). Further, for example, a cluster of even sense amplifiers 240B includes an even sense amplifier exit region 241B that is centrally positioned among even sense amplifiers 240B. Further detail for even sense amplifiers 240 includes the lower even sense amplifiers (SA LE) are paired centrally and adjacent across the even sense amplifier exit region 241B, and the upper even sense amplifiers (SA UE) are clustered peripherally adjacent the centrally paired lower even sense amplifiers (SA LE).

With reference to the first array subregion 102A, electrical coupling to sub-word line drivers 242, includes lower odd sub-word line drivers (SA LO) that are closer to the word line exit regions 106 than upper odd sub-word line drivers (SA UO) that are paired with a given lower odd sub-word line driver (SA LO). For example a pairing of two odd sub-word line drivers 242A, includes a lower odd sub-word line driver (SWD LO) that is adjacent an odd word line exit region 106A, and an upper odd sub-word line driver (SWD UO) is adjacent the lower odd sub-word line driver (SWD LO), such that the lower odd sub-word line driver (SWD LO) is closer to the odd word line exit region 106A, than is the upper odd sub-word line driver (SWD UO) with which it is paired. Similarly for example, a pairing of two even sub-word line drivers 242B, includes a lower even sub-word line driver (SWD LE) that is adjacent an even sub-word line exit region 106B, and an upper even sub-word line driver (SWD UE) is adjacent the lower even sub-word line driver (SWD LE), such that the lower even sub-word line driver (SWD LE) is closer to the even word line exit region 106B, than is the upper even sub-word line driver (SWD UE) with which it is paired. Further detail for coupling digit lines 118 and word lines 120 to respective sense amplifiers and sub-word line drivers is set forth herein.

Figure 2A:
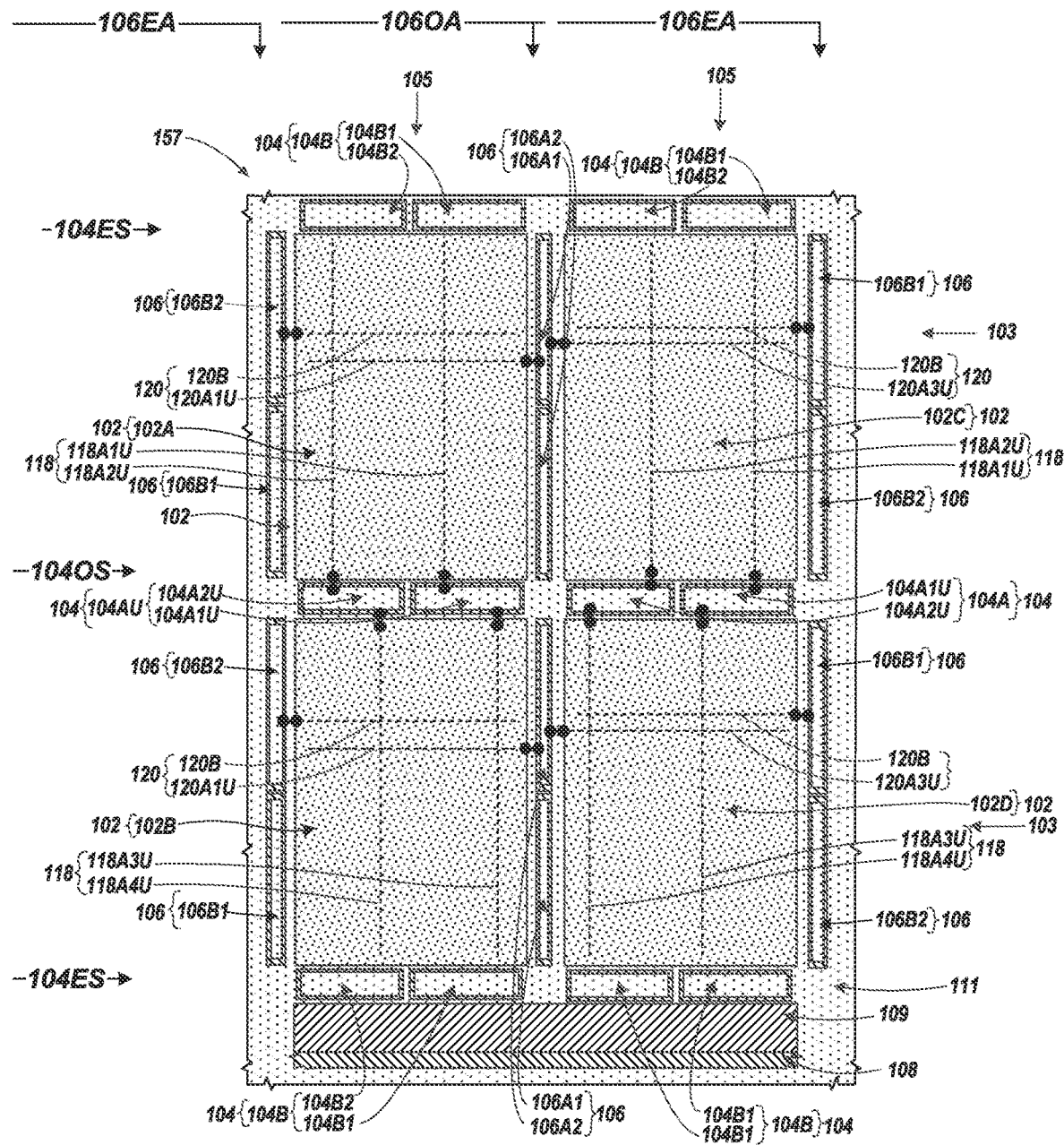
FIG. 2A is a simplified plan view of an upper array portion of the microelectronic device depicted in FIG. 1.
Figure 2B:
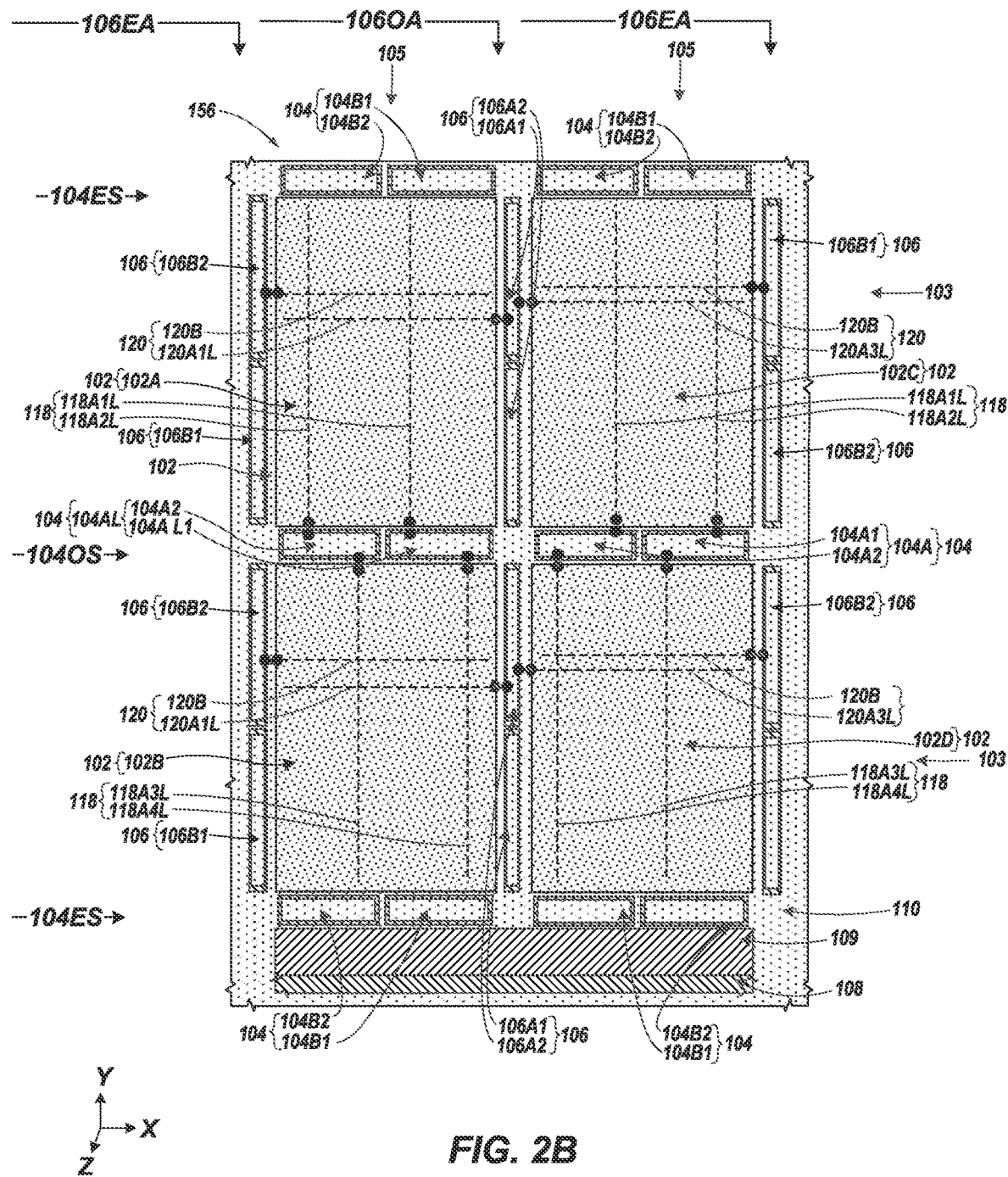
FIG. 2B is a simplified plan view of a lower array portion of the microelectronic device depicted in FIG. 1.

FIG. 2A is a simplified plan view of the upper memory array device assembly 157 (e.g., FIG. 4), that is part of the microelectronic device 101. FIG. 2B is a simplified plan view of the lower memory array device assembly 156 (e.g., FIG. 4) that is also part of the microelectronic device 101. For each of the respective lower and upper memory array device assemblies, 156 and 157, supporting logic structures (not illustrated), such as decoupling capacitors, may be located within the memory array device assemblies. The lower memory array device assembly 156 may be back-to-front (B2F) physically connected (e.g., physically attached) to the upper memory array device assembly 157 (e.g., FIGS. 4 and 8) by way of at least one bond (e.g., at least one oxide-oxide bond), such as a first oxide-oxide bond of the bottom isolation structure 234 (FIG. 4), as further set forth herein. With continued reference to FIG. 2A, the upper memory array device assembly 157 may be B2F configured between the CMOS device assembly 218 (FIG. 4), and with the lower memory array device assembly 156 (FIGS. 2B and 4), each with at least a bond (e.g., an oxide-oxide bond), such as the first oxide bond of the bottom isolation structure 234 (FIG. 4) that mates the lower memory array device assembly 156 to the upper memory array device assembly 157, and with at least at least an additional bond (e.g., an additional oxide-oxide bond), such as an upper, or second oxide bond of the top isolation structure 235 (FIG. 4) that mates the upper memory array device assembly 157 to the CMOS device assembly 218 (FIG. 4). Put another way, the upper memory array device assembly 157 may be attached (e.g., bonded) to the lower memory array device assembly 156 on a first side, and the upper memory array device assembly 157 may be attached (e.g., bonded) to the CMOS device assembly 218 on a second side that is opposite the first side.

With continued reference to FIG. 2A, between the first array subregion 102A and the second array subregion 102B of the upper memory array device assembly 157, upper odd digit line exit regions 104AU include an individual first upper odd digit line exit region 104A1U that may be configured and positioned to facilitate electrical connections between a group of upper odd digit lines (e.g., first and third upper odd digit lines 118A1U and 118A3U), and an individual second upper odd digit line exit region 104A2U that may be configured and positioned to facilitate electrical connections between a group of upper odd digit lines (e.g., second and fourth upper odd digit lines 118A2U and 118A4U). The several electrical connections facilitate coupling to a group of control logic devices (e.g., upper odd SA devices 240A (FIGS. 1 and 4)) operatively associated with an upper odd digit lines e.g., 118A1U. Upper even digit lines are not set forth herein for clarity of the illustrated upper odd digit lines 118AU, but the upper even digit lines are similarly configured and positioned to be coupled with even digit line exit regions 104B, and with several electrical connections to facilitate coupling to a group of control logic device (e.g., upper even SA devices 240B (FIGS. 1 and 4)).

Still referring to FIG. 2A, the word line exit regions 106 of the upper memory array device assembly 157 of the microelectronic device 101 may comprise horizontal areas that are configured and positioned to have at least some word lines 120 (e.g., access lines) horizontally terminate therein. The word lines 120 extend below the array subregions 102 in the second direction (X-direction, FIG. 4). For an individual word line exit region 106, at least some word lines 120 operatively associated with the array subregions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the word lines 120. As described in further detail below, some of the contact structures within the word line exit regions 106 may couple the word lines 120 to control logic circuitry of additional control logic devices (e.g., sub-word line driver (SWD) devices) that are positioned in the CMOS device assembly 218 (e.g., FIG. 4). For example a first upper odd word line 120A1U and a third upper odd word line 120A3U are coupled to a first odd word line exit region 106A1 that is horizontally between the first array subregion 102A and the third array subregion 102C. Even word lines 120B are similarly illustrated but further detail is not set forth for the sake of brevity and simplicity, except the even word lines 120B are coupled to even word line exit regions 106B.

With continued reference to FIG. 2A, the socket regions 108 of the upper memory array device assembly 157 of the microelectronic device 101 may comprise horizontal areas of the microelectronic device 101 configured and positioned to facilitate electrical connections (e.g., by way of contact structures and routing structures formed within horizontal boundaries thereof) between control logic circuitry region 109 and additional structures (e.g., back-end-of-line (BEOL) structures), as described in further detail below. The socket regions 108 may horizontally neighbor one or more peripheral horizontal boundaries (e.g., in the Y-direction, in the X-direction) of one or more groups of the array subregions 102. For clarity and ease of understanding of the drawings and related description, FIG. 2A depicts the upper memory array device assembly 157 of the microelectronic device 101 to include one (1) socket region 108 horizontally neighboring a shared horizontal boundary of a control logic circuitry region 109, which is horizontally neighboring a shared horizontal boundary of the second array subregion 102B and the fourth array subregion 102D. However, the upper memory array device assembly 157 of the microelectronic device 101 may be formed to include one or more of a different quantity and a different horizontal position of socket region(s) 108 and control logic circuitry region(s) 109. As a non-limiting example, the socket region 108 may horizontally neighbor a shared horizontal boundary of a different group of the array subregions 102 (e.g., a shared horizontal boundary of the third array subregion 102C and the fourth array subregion 102D, a shared horizontal boundary of the first array subregion 102A and the third array subregion 102C, a shared horizontal boundary of the first array subregion 102A and the second array subregion 102B). As another non-limiting example, the microelectronic device 101 may be formed to include multiple (e.g., a plurality of, more than one) socket regions 108 horizontally neighboring different groups of the array subregions 102 than one another. In some embodiments, multiple socket regions 108 collectively substantially horizontally surround (e.g., substantially horizontally circumscribe) the array subregions 102.

FIG. 2B is a simplified plan view of the lower memory array device assembly 156. The lower memory array device assembly 156 may be configured with the upper memory array device assembly 157, stacked (folded, oxide-oxide bonded, coupled) above it (FIG. 4). With continued reference to FIG. 2B, the lower memory array device assembly 156 may be positioned below the upper memory array device assembly 157 (FIGS. 2A and 4), and the upper memory array device assembly 157 may be positioned below the CMOS device assembly 218 (FIG. 4).

Similar to the upper memory array device assembly 157 (FIG. 2A), the lower memory array device assembly 156 has analogous structures. As described in further detail herein, between a first array subregion 102A and a second array subregion 102B, odd digit line exit regions 104A include an individual first lower odd digit line exit region 104AL1 that may be configured and positioned to facilitate electrical connections between a group of lower odd digit lines (e.g., first and third lower odd digit lines 118A1L and 118A3L), and an individual second lower digit line exit region 104AL2 may be configured and positioned to facilitate electrical connections between a group of lower odd digit lines (e.g., second and fourth lower odd digit lines 118A2L and 118A4L, FIG. 2A), and a group of control logic devices (e.g., lower odd SA devices, FIGS. 1 and 4) operatively associated with lower odd digit lines. Still referring to FIG. 2B, the lower word line exit regions 106L of the lower memory array device assembly 156 of the microelectronic device 101 may comprise horizontal areas of the lower memory array device assembly 156 of the microelectronic device 101 configured and positioned to have at least some word lines 120 (e.g., access lines) horizontally terminate therein. The word lines 120 extend below the array subregions 102 in a second direction (X-direction, FIG. 4). For an individual word line exit region 106, at least some word lines 120 operatively associated with the array subregions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the word lines 120. As described in further detail below, some of the contact structures within the word line exit regions 106 may couple the word lines 120 to control logic circuitry of additional control logic devices (e.g., sub-word line driver (SWD) devices) that are positioned in the CMOS device assembly 218 (e.g., FIG. 4). For example a first lower odd word line 120A1L and a third lower odd word line 120A3L are coupled to a lower first odd word line exit region 106A1 that is horizontally between the first array subregion 102A and the third array subregion 102C. Even word lines 120B are also set forth in simplified detail, and the even word lines 120B are coupled to even word line exit regions 106B.

With continued reference to FIG. 2B, the socket regions 108 of the lower memory array device assembly 156 of the microelectronic device 101 may horizontally correspond (X-direction and Y-direction) to socket regions 108 of the upper memory array device assembly 157 (FIG. 2A) to facilitate electrical connections (e.g., by way of contact structures and routing structures formed within horizontal boundaries thereof) between control logic circuitry region 109 and additional structures (e.g., back-end-of-line (BEOL) structures), as described in further detail below.

Figure 3:
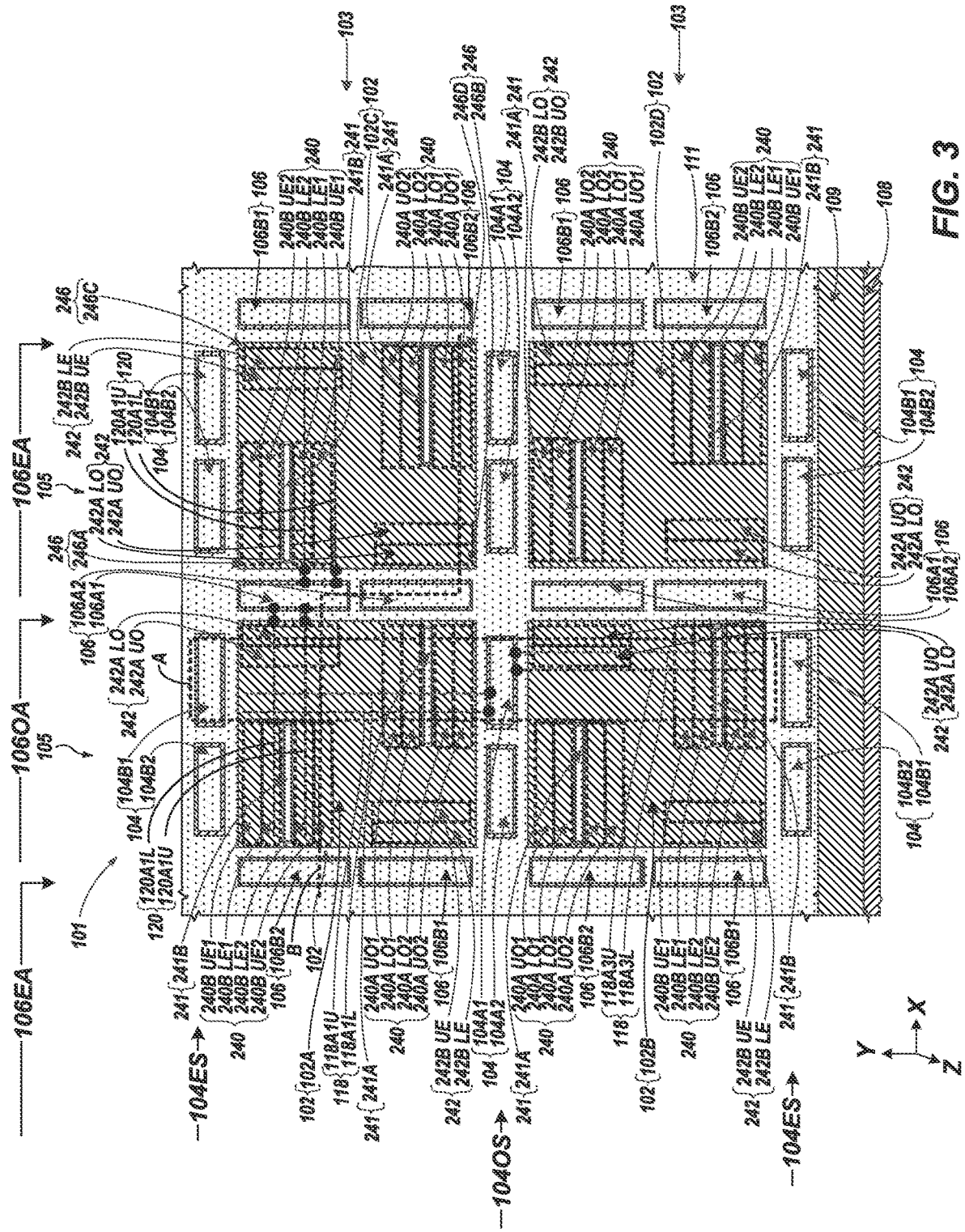
FIG. 3 is a more detailed plan view of portions of the upper array portion depicted in FIG. 2A, portions of the lower array portion depicted in FIG. 2B, and control logic devices including the control logic devices in the microelectronic device depicted in FIG. 1.

FIG. 3 is a simplified plan view of selected structures of the microelectronic device 101 depicted in FIGS. 1, 2A, 2B, and 4, with illustrative examples of selected first and third lower odd digit lines 118A1L and 118A3L, and selected upper odd digit lines 118A1U and 118A3U. The several selected first and third lower odd digit lines 118A1L and 118A3L and the several selected upper odd digit lines 118A1U and 118A3U may be coupled with at least some conductive features within a first odd digit line exit region 104A1. In addition, the at least some conductive features within the first odd digit line exit region 104A1 may be coupled to the cluster of odd sense amplifiers 240 located in the CMOS device assembly 218 (FIG. 4) within horizontal boundaries of the first array subregion 102A. Similarly, illustrative examples of selected first and third lower odd word lines 120A1L and 120A3L, and selected first and third upper odd word lines 120A1U and 120A3U may be coupled at least some additional conductive features within a first odd word line exit region 106A1. Even digit lines 118B and even word lines 120B are not set forth in FIG. 3 for clarity as ease of understanding the drawings and associated description, but such even digit and word lines may be coupled to at least some further conductive features with respective even digit line exit regions 104B and even word line exit regions 106B.

Further referring to FIG. 3, the microelectronic device 101 includes the selected first and third lower odd digit lines 118A1L and 118A3L from the lower memory array device assembly 156 (FIG. 2B), and the selected upper odd digit lines 118A1U and 118A3U from the upper memory array device assembly 157 (FIG. 2A). The open architecture includes coupling at least two of selected digit lines 118 from adjacent array subregions 102 where, e.g., signals from digit lines 118 from neighboring array subregions 102 may be processed within horizontal boundaries of a single array subregion 102 in the control logic device assembly such as within the CMOS device assembly 218 (FIG. 4). For example between the first array subregion 102A and the second array subregion 102B, signals from first and third lower odd digit lines 118A1L and 118A3L may be received within a first odd digit line exit region 104A1, and may be directed to lower odd sense amplifier circuit devices 240A LO1 and 240A LO2, respectively. Further for example between the first array subregion 102A and the second array subregion 102B, signals from first and third upper odd digit lines 118A1U and 118A3U may be received within the first odd digit line exit region 104A1, and may be directed to upper odd sense amplifier circuit devices 240A UO1 and 240A UO2, respectively.

With reference to the first array subregion 102A, sense amplifier exit regions 241 may individually be centrally positioned among a cluster of sense amplifiers 240 and may individually include conductive features (e.g., conductive routing) in electrical communication with the cluster of sense amplifiers 240. For example, a cluster of odd sense amplifiers 240A may have an odd sense amplifier exit region 241A centrally positioned among the odd sense amplifiers 240A. Further detail for odd sense amplifiers 240A and odd sense amplifier exit regions 241A, include upper odd sense amplifiers 204A UO1 and 240A UO2, and lower odd sense amplifiers 204A LO1 and 204A LO2. The lower odd sense amplifiers 240A LO1 and 240A LO2 may be paired centrally adjacent and across the odd sense amplifier exit region 241A, and the upper odd sense amplifiers 240A UO1 and 240A UO2 may be horizontally positioned peripherally adjacent the paired lower odd sense amplifiers 240A LO1 and 240A LO2. Further, for example, a cluster of even sense amplifiers 240B may have an even sense amplifier exit region 241B centrally positioned among even sense amplifiers 240B. Further detail for even sense amplifiers 240B includes the lower even sense amplifiers 240B LE1 and 240B LE2 that may be paired centrally adjacent and across the even sense amplifier exit region 241B, and the upper even sense amplifiers 240B UE1 and 240B UE2 that may be horizontally positioned peripherally adjacent the paired even lower sense amplifiers 240B LE1 and 240B LE2.

With reference to the first array subregion 102A, lower odd sub-word line drivers 242A LO may individually include conductive features (e.g., conductive routing) in electrical communication with the sub-word line drivers 242, and may individually be closer to the odd word line exit regions 106A (e.g., the first odd word line exit region 106A1) than to upper odd sub-word line drivers 242A UO that are paired with a given lower odd sub-word line driver 242A LO. Similarly for example, a pairing of two even sub-word line drivers 242B, may include a lower even sub-word line driver 242B LE adjacent a first even word line exit region 106B1, and an upper even sub-word line driver 242B UE adjacent the lower even sub-word line driver 242B LE. The lower even sub-word line driver 242B LE may be closer to the even word line exit region 106B than is the upper even sub-word line driver 242B UE with which it is paired.

FIG. 4 is a simplified, transverse, cross-section elevation view of selected structures of the microelectronic device 101 that include the lower memory array device assembly 156, the upper memory array device assembly 157, and the CMOS device assembly 218, according to several embodiments. The cross-section view it taken at an angle Y' to the first direction (Y-directions) such as about 21 to illustrate both digit lines 118 and word lines 120 in cross section. Further, the word lines 120 are formed within a word line gate oxide material 123. The lower memory array device assembly 156 may be referred to as a first microelectronic device assembly 156, the upper memory array device assembly 157 may be referred to as a second microelectronic device assembly 157, and the CMOS device assembly 218 may be referred to as a third microelectronic device assembly 218. The cross-section view may be taken from the section A in FIG. 3, where the cross-section view includes the first array subregion 102A for both the first microelectronic device assembly 156 and the second microelectronic device assembly 157, the second array subregion 102B also for both the first microelectronic device assembly 156 and the second microelectronic device assembly 157, portions of the third microelectronic device assembly 218 that are superimposed above the second microelectronic device assembly 157, and the section A is particularly expanded to include the first digit line exit region 104A1 with the first and third lower odd digit lines 118A1L and 118A3L, and the first and third upper odd digit lines 118A1U and 118A3U.

Referring to FIG. 4, the third microelectronic device assembly 218 (e.g., CMOS device structure, CMOS device wafer) includes control logic circuitry 191, SWD sections 242 of the control logic circuitry 191, SA sections 240 of the control logic circuitry 191, and additional control logic circuitry 191 such as read-write gap (RW_gap) circuitry (not illustrated) and other circuitry.

Lateral (Y-direction) boundaries may be defined at the level of the first microelectronic device assembly 156 and the second microelectronic device assembly 157. Overall for the microelectronic device 101 as depicted in FIG. 4, the odd digit line exit region boundaries may be defined by an odd digit line socket region 218AD, that is within the third microelectronic device assembly 218 and located between the first array subregion 102A and the second array subregion 102B. Similarly overall for the microelectronic device 101, the even digit line exit region boundaries may be defined by an even digit line socket region 218BD, that is within the third microelectronic device assembly 218, and adjacent left to the first array subregion 102A.

Lateral first-direction (Y-direction) boundaries are defined at the level of the first microelectronic device assembly 156. The lateral first-direction boundaries include a first lower odd digit line socket region 156A D1 for the first lower odd digit line exit region 104A1L (e.g., seen in FIG. 3 as 104A1, between the first array subregion 102A and the second array subregion 102B) by base semiconductor material 110 and dielectric material 114 that fills the first lower odd digit line socket region 156A D1 for the first lower odd digit line exit region 104A1L, where the dielectric material 114 is also present among other regions. The dielectric material 114 is depicted generally, and particularly as a filled trench 112 among transistor structures, but the dielectric material 114 may be present in several separate structures among the base semiconductor material 110 of the first (lower) microelectronic device assembly 156, where the several separate structures of the dielectric material 114 are achieved by techniques that depend upon processing choices. Similarly, lateral (Y-direction) boundaries are defined at the level of the first microelectronic device assembly 156, at a first lower even digit line socket region 156B D1 for the first lower even digit line exit region 104B1L (e.g., seen in FIG. 3 as 104B1 adjacent left the first array subregion 102A). The first lower even digit line socket region 156B D1 is laterally across from the first lower odd digit line socket region 156A D1, where the dielectric material 114 fills boundaries defined by the base semiconductor material 110.

Lateral first-direction boundaries are also defined at the level of the second microelectronic device assembly 157. The lateral first-direction boundaries include a first upper odd digit line socket region 157A D1 for the first upper odd digit line exit region 104A1U (e.g., seen in FIG. 3 as 104A1) by base semiconductor material 111 and dielectric material 115 that fills the first upper odd digit line socket region 157A D1, where the dielectric material 115 is also present among other regions. The dielectric material 115 is depicted generally, and particularly as a filled trench 113, but the dielectric material 115 may be present in several separate structures among the base semiconductor material 111, where the several separate structures of the dielectric material 115 are achieved by techniques that depend upon processing choices. Similarly, boundaries are defined for the second microelectronic device assembly 157 at a first upper even digit line socket region 157B D1 for the first even digit line exit region 104B1 (seen in FIG. 3 as 104B1 adjacent the first array subregion 102A). The first upper even digit line socket region 157B D1 is laterally across from the first upper odd digit line socket region 157A D1, where the dielectric material 115 fills boundaries defined by the base semiconductor material 111. The first upper odd digit line socket region 157A D1 is wider than the first lower odd digit line socket region 156A D1, such that a "window" exists at the first-direction (Y-direction) lateral boundaries of the base semiconductor material 111, through dielectric material 115, and encompasses the first lower odd digit line socket region 156A D1 in a rectangular framing configuration when observed from a top plan view. The rectangular framing configuration of the first upper odd digit line socket region 157A D1 may only be larger than the first lower odd digit line socket region 156A D1 in the first direction (Y-direction). Similarly it is observed that the first upper even digit line socket region 157B D1 is wider than the first lower even digit line socket region 156B D1, such that a window is created at the boundaries of the base semiconductor material 111, through dielectric material 115, and encompasses the first lower even digit line socket region 156B D1 in a rectangular framing configuration when observed from a top plan view. The rectangular framing configuration of the first upper even digit line socket region 157B D1 may only be larger than the first lower even digit line socket region 156B D1 in the first direction (Y-direction).

Further referring to FIG. 4 for clarity, the first microelectronic device assembly 156 is set forth in some detail at the second array subregion 102B, and the first microelectronic device assembly 156 is set forth more generally at the first array subregion 102A. Similarly but contrariwise referring to FIG. 4, the second microelectronic device assembly 157 is set form in some detail at the first array subregion 102A, and the second microelectronic device assembly 157 is set forth more generally at the second array subregion 102B. Similar structures among the first microelectronic device assembly 156 and the second microelectronic device assembly 157 may be enumerated with identical reference numerals. The base semiconductor material 110 of the first microelectronic device assembly 156, however, is distinguished from the base semiconductor material 111 of the second microelectronic device assembly 157. Similarly, the dielectric material 114 of the first microelectronic device assembly 156 is distinguished from the dielectric material 115 of the second microelectronic device assembly 157.

Further referring to FIG. 4, both the first microelectronic device assembly 156 and the second microelectronic device assembly 157 include array subregions 102 of the microelectronic device 101 that are configured and positioned to have arrays of memory cells (e.g., arrays of DRAM cells) positioned within horizontal boundaries (e.g., horizontal areas) thereof, as described in further detail below. In addition, the array subregions 102 (e.g., the first array subregion 102A, the second array subregion 102B, the third array subregion 102C (e.g., FIG. 3), and the fourth array subregion 102D (e.g., FIG. 3)) may also be configured and positioned to have desirable arrangements of the control logic circuitry 191 that are positioned within horizontal boundaries thereof, as also described in further detail below. The control logic circuitry 191 may be vertically offset (e.g., vertically overlie, in the Z-direction) from the memory cells in the second microelectronic device assembly 157.

The following refers to the first microelectronic device assembly 156, and it may also refer to the second microelectronic device assembly 157. Referring collectively to FIGS. 2A, 2B, 3, and 4, the first microelectronic device assembly 156 includes arrays of memory cells 146 positioned within horizontal areas of the array subregions 102. At least some of the different control logic circuitry 191 of the third microelectronic device assembly 218 may be coupled to the memory cells 146 of the first microelectronic device assembly 156. Similarly for the second microelectronic device assembly 157, memory cells 146 are positioned within horizontal areas of the array subregions 102. For clarity and ease of understanding the description, not all features (e.g., structures, materials, regions, devices) of the microelectronic device 101 described below with reference to FIGS. 1, 2A, 2B, and 3 are illustrated in FIG. 4.

In an embodiment for the first microelectronic device assembly 156, the first base semiconductor structure 110 includes the only semiconductor material in the first microelectronic device assembly 156. Accordingly, an open architecture may facilitate different arrangements of odd digit lines 118A (FIG. 2B) enumerated, e.g., 1, 3, 5, 7 . . . (n+1), and even digit lines 118B (FIG. 2A), enumerated e.g., 0, 2, 4, 6 . . . n. The odd digit lines 118A (FIG. 2B) may emerge from two horizontally neighboring array subregions 102 (FIG. 2B), at an odd digit line exit region 104A (FIG. 2B). The even digit line exit regions 104B (FIG. 2B) may emerge from two other horizontally neighboring array subregions 102 (FIG. 2B), at an even digit line exit region 104B (FIG. 2B). As illustrated in FIG. 4, access devices 116 (e.g., access transistors) may be located within boundaries of the array subregion 102 (FIGS. 2A and 2B). In addition, digit lines 118 (FIGS. 2A and 2B, e.g., data lines, bit lines) may be located to be coupled to the access devices 116 (FIG. 2A) and to horizontally extend in the Y-direction through the array subregion 102 (FIG. 2A). At least some of the digit lines 118 (FIGS. 2A and 2B) may terminate (e.g., end) within the digit line exit regions 104 (FIG. 2B). Furthermore, word lines 120 (e.g., access lines, FIG. 8) may be configured to be coupled to the access devices 116 (FIGS. 2A and 2B) and to horizontally extend in the X-direction through the array subregion 102 (FIG. 2A). At least some of the word lines 120 (FIGS. 2A through 2C) may terminate within the word line exit regions 106 (FIG. 2C).

The access devices 116 located within the array subregion 102 may be employed as components of memory cells (e.g., DRAM cells) located within the array subregion 102. By way of non-limiting example, each access device 116 may individually include a channel region comprising a portion of the first base semiconductor structure 110; a source region and a drain region each individually comprising one or more of at least one conductively doped portion of the first base semiconductor structure 110 and/or at least one conductive structure formed in, on, or over the first base semiconductor structure 110; and at least one gate structure comprising a portion of at least one of the digit lines 118. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extending in parallel in the X-direction orthogonal to the Y-direction. As used herein, the term "parallel" means substantially parallel. The digit lines 118 and the word lines 120 may each individually include conductive material. By way of non-limiting example, the digit lines 118 and the word lines 120 may each individually include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 each individually include one or more of W, Ru, Mo, and titanium nitride ($TiN_y$).

For the first microelectronic device assembly 156, the first lower odd digit line 118A1L exits the first array subregion 102A into the first lower odd digit line exit region 104A1L within the first lower odd digit line socket region 156A D1, and the third lower odd digit line 118A3L exits the second array subregion 102B into the first lower odd digit line exit region 104A1L within the first lower odd digit line socket region 156A D1. For the second microelectronic device assembly 157, the first upper odd digit line 118A1U exits the first array subregion 102A into the first odd digit line exit region 104A1 within the first upper odd digit line socket region 157A D1, and the third upper odd digit line 118A3U exits the second array subregion 102B, also into the first upper odd digit line exit region 104A1U within the first upper odd digit line socket region 157A D1. Consequently for both first and second microelectronic device assemblies 156 and 157, odd digit lines 118A from adjacent array subregions 102A, 102B may be received in a common odd digit line exit region 104A1, and electrical connections for the odd digit lines 118A so enumerated, couple the third microelectronic device assembly 218 with the respective first and second microelectronic device assemblies 156 and 157.

Within the array region 102 for each of the respective first and second microelectronic device assemblies 156 and 157, additional features (e.g., structures, materials) are also located on, over, and/or between the access devices 116, the digit lines 118, and the word lines 120. For example, as shown in FIG. 4, first contact structures 122 (e.g., digit line contact structures, also referred to as so-called "bitcon" structures) may be configured to vertically extend between and couple the access devices 116 to the digit lines 118; second contact structures 124 (e.g., cell contact structures, also referred to as so-called "cellcon" structures) may be in contact with the access devices 116 and may be coupled to the access devices 116 to storage node devices (e.g., capacitors); dielectric cap structures 126 may be on or over the digit lines 118; and additional dielectric cap structures 128 may be on or over the word lines 120. In addition, dielectric structures (e.g., dielectric spacers, such as low-k dielectric spacers formed of and including one or more low-k dielectric materials) may intervene (e.g., horizontally intervene) between and isolate the second contact structures 124 and digit lines 118; and further dielectric structures (e.g., gate dielectric structures, such as gate dielectric oxide structures) may intervene (e.g., horizontally intervene) between and isolate the first contact structures 122 and the word lines 120.

The first contact structures 122 and the second contact structures 124 may individually include at least one conductive material. In some embodiments, the first contact structures 122 and the second contact structures 124 individually include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 126 and the additional dielectric cap structures 128 may individually include at least one insulative material. In some embodiments, the dielectric cap structures 126 and the additional dielectric cap structures 128 are individually formed of and include a dielectric nitride material (e.g., $SiN_y$, such as $Si_3N_4$).

As shown in FIG. 4, for each of the first microelectronic device assembly 156 and the second microelectronic device assembly 157, within the array regions 102, at least one first routing tier 134 including first routing structures 136 may be located over the access devices 116; and storage node devices 138 (e.g., capacitors) may be located over and in electrical communication with at least some of the first routing structures 136; and a second routing tier 142 including second routing structures 144 may be located over the storage node devices 138.

The first routing structures 136 of the first routing tier 134 may be employed to facilitate electrical communication between additional features (e.g., structures, materials, devices) coupled thereto. In some embodiments, at least some of the first routing structures 136 couple the access devices 116 to the storage node devices 138 to form the memory cells 146. The first routing structures 136 may serve as redistribution structures to operatively connect an array of the access devices 116 having a first layout configuration to an array of the storage node devices 138 having a second, different layout configuration. The first routing structures 136 may each individually include conductive material. By way of non-limiting example, the first routing structures 136 may include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 136 are formed of and include W.

Still referring to FIG. 4, within the first microelectronic device assembly 156, interconnection of the digit lines 118 to the sense amplifiers 240 in the third microelectronic device assembly 218 includes first and third lower digit line interconnects 298D1L and 298D3L. The first and third lower digit line interconnects 298D1L and 298D3L may also be referred to as lower "vertical digit line contacts" (LVDL-CON) 298DL. The first and third lower vertical digit line contacts 298D1L and 298D3L may contact (e.g., physically contact, electrically contact) portions of the second routing structures 144 of the second routing tier 142 within the first microelectronic device assembly 156, within horizontal areas of the digit line exit regions 104. In an embodiment, the first and third lower digit line interconnects 298D1L and 298D3L are individually substantially monolithic (e.g., unitary) and vertically extend (e.g., in the Z-direction) at least between the respective first and third lower odd digit lines 118A1L and 118A3L, and the second routing tier 142 within the first microelectronic device assembly 156. In an embodiment, one or more of the first and third lower digit line interconnects 298D1L and 298D3L vertically extend into the respective first and third lower odd digit lines 118A1L and 118A3L. In an embodiment, a vertical height of each of the respective first and third lower digit line interconnects 298D1L and 298D3L is greater than a combined vertical height of the first routing structures 136 and the storage node devices 138 within the first microelectronic device assembly 156.

Further interconnection of portions of the respective first and third lower odd digit lines 118A1L and 118A3L within the digit line exit regions 104 to the sense amplifiers 240 includes second conductive routing structure assemblies 299 that may include second redistribution structure pads 299 at a K1 redistribution layer within the first microelectronic device assembly 156 at a bottom isolation structure 234 that may be at the same level as the second routing tier 142 of the first microelectronic device assembly 156. The second redistribution structure pads 299 may be part of conductive routing structure assemblies at a K1 level within the first microelectronic device assembly 156. The bottom isolation structure 234 includes isolation materials 164 of the first microelectronic device assembly 156 and isolation materials 226 of the second microelectronic device assembly 157. Further interconnection of portions of the respective first and third lower odd digit lines 118A1L and 118A3L within the digit line exit regions 104 to the sense amplifiers 240 includes third conductive routing structure assemblies 301 that may include third interface contact pads at the K2 redistribution layer within the second microelectronic device assembly 157 that may couple to, e.g., odd sense amplifiers 240A with lateral interconnects 199 (e.g., FIG. 5) within the third conductive routing structure assembly 301 at the K2 redistribution layer. The conductive contact pads of the third conductive routing structure assemblies 301 may directly contact subsequent lower digit line contacts 298D1LS coupled to the first lower digit line interconnects 298D1L. The subsequent lower interconnect 218D1LS may be located at the same elevation (Z-height) as the first and third upper digit line contacts 298D1U and 298D3U. Other electrical structures may intervene between the first lower digit line interconnects 298D1L and the subsequent lower digit line contacts 298D1LS. The lateral interconnects 199 (e.g., FIG. 5, horizontal conductive routing structures) may extend transversely from and out of the digit line exit regions 104 within the conductive routing structure assembly of the K2 redistribution layer, and the lateral interconnect 199 (e.g., FIG. 5) to the sense amplifiers 240, where the sense amplifiers 240 are vertically above (Z-direction) memory cells 146 (FIGS. 2A and 2B) within the array subregions 102 of the respective first and second microelectronic device assemblies 156 and 157. Similarly, interconnection of portions of the respective first and third upper odd digit lines 118A1U and 118A3U within the digit line exit regions 104 to the sense amplifiers 204 may include the interface contact pads of the third conductive routing structure assembly 301 at the K2 redistribution layer within the second microelectronic device assembly 157 at the top isolation structure 235.

FIG. 5 is a simplified top plan view of portions of a cluster of odd sense amplifiers 240A of the third microelectronic device assembly 218 (FIG. 4) within the first array subregion 102A, according to several embodiments. In general control, the control logic circuitry 191 depicted in, e.g., FIG. 4, is specifically set forth as a portion of control logic circuitry 291 in FIG. 5. The first odd sense amplifier exit region 241A1 may be located centrally among a bilateral cluster of odd sense amplifiers 240. The first odd sense amplifier exit region 241A1 is schematically connected to the first odd digit line exit region 104A1, indicated by dashed lines. The conductive routing structure assembly that includes the interface contact pads of the third conductive routing structure assembly 301 (FIG. 4) are depicted schematically at boundaries of the first odd digit line exit region 104A1 at the K2 redistribution level (FIG. 4). Other interface contact pads of the third conductive routing structure assembly 301 are also schematically depicted at boundaries of the first odd sense amplifier exit region 241A1 at the K2 redistribution level (FIG. 4). The lower first odd sense amplifier 240A LO1 (also FIG. 3) and the lower second odd sense amplifier 240A LO2 (also FIG. 3) are paired horizontally across from and adjacent the first odd sense amplifier exit region 241A1. The upper first odd sense amplifier 240A UO1 (also FIG. 3) and the upper second odd sense amplifier 240A UO2 (also FIG. 3) are clustered peripherally adjacent the respective lower first odd sense amplifier 240A LO1 and the lower second odd sense amplifier 240A LO2.

Individual sub-circuitry within a given sense amplifier section is represented in simplified form, both with functional acronyms and relative position. For example in the lower first odd sense amplifier 240A LO1 column select (CS) circuitry is adjacent the boundaries of the first odd sense amplifier exit region 241A1. Adjacent the CS circuitry in the lower first odd sense amplifier 240A LO1, is NMOS sense amplifier sub-circuitry (NSA), and adjacent the NSA is voltage transfer characteristic (VTC) sense amplifier sub-circuitry. Further and adjacent the VTC sense amplifier sub-circuitry is PMOS sense amplifier sub-circuitry (PSA). The balance of the first odd sense amplifier 240A LO1 is a "mirror image" repetition of sub-circuitry: PSA, VTC, and NSA to complete simplified sub-circuitry within the first odd sense amplifier 240A LO1.

Lower lateral interconnects 199L of the conductive routing structure assemblies each exit the first odd sense amplifier exit region 241A1, and each lower lateral interconnect 199L couples to CS sub-circuitry within the respective lower first and second odd sense amplifier assemblies 240A LO1 and 240A LO2. Upper lateral interconnects 199U each exit the first odd sense amplifier exit region 241A1, and each upper lateral interconnect 199U couples to CS circuitry within the respective upper first and second odd sense amplifiers 240A UO1 and 240A UO2. In an embodiment, a given lower lateral interconnect 199L has a shorter routing path (shorter length, shorter physical distance) from a sense amplifier exit region 241 to the corresponding lower sense amplifier 240L, than the corresponding upper lateral interconnect 199U to the corresponding upper sense amplifier 240U. Put another way, a given lower sense amplifier 240L may be coupled with a lower lateral interconnect 199L within the conductive routing structure assemblies at the K2 routing level from third contact pads of the third conductive routing structure assembly 301 at the sense amplifier exit region 241, with a shorter routing distance, than the corresponding upper sense amplifier 240U may be coupled with an upper lateral interconnect 199U, also and the K2 routing level from the contact pads of the third conductive routing structure assembly 301 at the sense amplifier exit region 241. In an embodiment, the CS circuitry for the lower sense amplifier 240L is located closer to the sense amplifier exit region 241, than is the CS circuitry for the upper sense amplifier 240U. In FIG. 5, the CS circuitries for adjacent lower and upper sense amplifier assemblies 240 are at opposite boundaries of each half of the sense amplifier cluster 240. Even sense amplifiers 240B may also be similarly arranged such that routing from the even sense amplifier exit regions 241B is shorter to CS circuitry for lower even sense amplifiers 240B than to upper even sense amplifiers 240B. In an embodiment read-write gap (RW_gap) circuitry is located elsewhere within the CMOS device assembly 218 (e.g., FIGS. 3 and 4), such that it is distant from the sense amplifier cluster 240, but the RW_gap circuitry may be located between a sense amplifier cluster 240 and a paired sub-word line driver circuitry 242 (e.g., FIG. 3).

FIG. 6 is a simplified top plan view of portions of a cluster of odd sense amplifiers 240A depicted in the third microelectronic device assembly 218 (FIG. 4) within the first array subregion 102A, according to several embodiments. In general, a portion of the control logic circuitry 191 depicted in, e.g., FIG. 4, is specifically set forth as a portion of control logic circuitry 391 in FIG. 6. The first odd sense amplifier exit region 241A1 may be located centrally among the cluster of odd sense amplifiers 240A. For clarity and simplicity, in FIG. 6, while it will be understood that features of the first odd sense amplifier exit region 241A1 and the first odd digit line exit region 104A1 are coupled to one another, no schematic coupling is depicted, in order to clearly illustrate lower and upper lateral interconnects 199L and 199U. The interface contact pads of the third conductive routing structure assembly 301 (FIG. 4) are depicted schematically at boundaries of the first odd digit line exit region 104A1 at conductive routing structure assemblies that include the K2 redistribution level (FIG. 4). Other interface contact pads of the third conductive routing structure assembly 301 are also schematically depicted at boundaries of the first odd sense amplifier exit region 241A1 at conductive routing structure assemblies that include the K2 redistribution level (FIG. 4). The lower first odd sense amplifier 240A LO1 and the lower second odd sense amplifier 240A LO2 are bilaterally paired horizontally across from and adjacent the first odd sense amplifier exit region 241A1. The upper first odd sense amplifier 240A UO1 and the upper second odd sense amplifier 240A UO2 are clustered peripherally adjacent the respective lower first odd sense amplifier 240A LO1 and the lower second odd sense amplifier 240A LO2.

Individual sub-circuitry within a given sense amplifier section is represented in simplified form, both with functional acronyms and relative position. For example in the lower first odd sense amplifier 240A LO1 column select (CS) circuitry is centrally located with respect to the lower first odd sense amplifier 240A LO1 and the upper first odd sense amplifier 240A UO1, and the CS sub-circuitry is distal from the boundaries of the first odd sense amplifier exit region 241A1. Adjacent the CS sub-circuitry in the lower first odd sense amplifier 240A LO1, is NMOS sense amplifier sub-circuitry (NSA), which is closer to the first odd sense amplifier exit region 241A1 than is the CS sub-circuitry. Adjacent the NSA is voltage transfer characteristic (VTC) sense amplifier sub-circuitry. Further and adjacent the VTC sense amplifier sub-circuitry is PMOS sense amplifier sub-circuitry (PSA). The balance of the first odd sense amplifier 240A LO1 is a "mirror image" repetition of sub-circuitry: PSA, VTC, and NSA to complete simplified sub-circuitry within the first odd sense amplifier 240A LO1, where the second NSA is adjacent the first odd sense amplifier exit region 241A1.

Lower lateral interconnects 199L of the conductive routing structure assemblies, may each exit the first odd sense amplifier exit region 241A1, and each lower lateral interconnect 199L may couple to CS sub-circuitry within the respective lower first and second odd sense amplifiers 240A LO1 and 240A LO2. Upper lateral interconnects 199U may each exit the first odd sense amplifier exit region 241A1, and each upper lateral interconnect 199U may couple to CS circuitry within the respective upper first and second odd sense amplifiers 240A UO1 and 240A UO2. In an embodiment, a given lower lateral interconnect 199L has a shorter routing path (shorter length, shorter physical distance) at the K2 redistribution level (FIG. 4) from a digit line exit region 104 to the corresponding lower sense amplifier 240L, than the corresponding upper lateral interconnect 199U to the corresponding upper sense amplifier 240U. Put another way, a given lower sense amplifier 240 may be connected at the K2 routing level from the contact pads of the third conductive routing structure assembly 301 of the conductive routing structure assemblies with a shorter routing distance with the lower lateral interconnect 199L than the corresponding upper sense amplifier 240 is connected at the K2 routing level from the contact pads of the third conductive routing structure assembly 301 of the conductive routing structure assemblies by the upper lateral interconnect 199U. In an embodiment, the CS circuitry for the lower sense amplifier 240L is located closer to the sense amplifier exit region 241 than is the CS circuitry for the upper sense amplifier 240U. In FIG. 6, the CS circuitries for adjacent lower and upper sense amplifiers, e.g., the lower first odd sense amplifier 240A LO1 and the upper first odd sense amplifier 240A UO1, are substantially adjacent at proximate boundaries. In an embodiment, a single CS circuitry is located for each half cluster of sense amplifiers 240, such that, e.g., the lower CS in the lower first odd sense amplifier 240A LO1 and the upper CS in the upper first odd sense amplifier 240A UO1 are configured as a single circuitry block. Even sense amplifiers 240B may also be similarly arranged such that routing from the even sense amplifier exit regions 241B is shorter to CS circuitry for lower even sense amplifiers 240B than to upper even sense amplifiers 240B. Similarly, in an embodiment, a single CS circuitry is located for each half cluster of sense amplifiers 240, such that, e.g., the lower CS in a lower first even sense amplifier (not illustrated) and an upper CS in an upper first even sense amplifier (not illustrated) are configured as a single circuitry block.

FIG. 7 is a simplified top plan view of portions of a cluster of odd sense amplifiers 240A for a configuration wherein lower and upper sense amplifiers 240 are clustered within a CMOS device (e.g., the third microelectronic device assembly 218 (FIG. 4)), in accordance with embodiments of the disclosure. In general, a portion of the general control logic circuitry 191 depicted in, e.g., FIG. 4, is specifically set forth as control logic circuitry 491 in FIG. 7. For clarity and simplicity, the sense amplifier cluster depicted in FIG. 7 is illustrated within a first array subregion 102A, such as the first array subregion 102A depicted in FIG. 4. In contrast with a single odd sense amplifier exit region 241A (e.g., the first odd sense amplifier exit regions 241A1 depicted in FIGS. 5 and 6), the cluster of odd sense amplifiers 240A includes two odd sense amplifier exit regions: a first paired first odd sense amplifier exit region 241A1A and a second paired first odd sense amplifier exit region 241A1B. For clarity and simplicity, in FIG. 7, it will be understood that features of the first paired first odd sense amplifier exit region 241A1A and second paired first odd sense amplifier exit region 241A1B are coupled to features of the first odd digit line exit region 104A1, but no schematic coupling is given, in order to more clearly illustrate lower and upper lateral interconnects 199L and 199U. The interface contact pads of the third conductive routing structure assembly 301 (e.g., FIG. 4) are depicted schematically at boundaries of the first odd digit line exit region 104A1 at the K2 redistribution level (e.g., FIG. 4). The first lower odd sense amplifier 240A LO1 and the second lower odd sense amplifier 240A LO2 are paired between the first paired first odd sense amplifier exit region 241A1A and the second paired first odd sense amplifier exit region 241A1B. The first upper odd sense amplifier 240A UO1 and the upper second odd sense amplifier 240A UO2 are clustered peripherally to the respective first lower odd sense amplifier 240A LO1 and the second lower odd sense amplifier 240A LO2.

Individual sub-circuitry within a given sense amplifier section is represented in simplified form, both with functional acronyms and relative position. For example in the lower first odd sense amplifier 240A LO1 column select (CS) circuitry is adjacent the boundaries of the first odd sense amplifier exit region 241A1. Adjacent the CS circuitry in the lower first odd sense amplifier 240A LO1, is NMOS sense amplifier sub-circuitry (NSA), and adjacent the NSA is voltage transfer characteristic (VTC) sense amplifier sub-circuitry. Further and adjacent the VTC sense amplifier sub-circuitry is PMOS sense amplifier sub-circuitry (PSA). The balance of the first odd sense amplifier 240A LO1 is a "mirror image" repetition of sub-circuitry: PSA, VTC, and NSA to complete simplified sub-circuitry within the first odd sense amplifier 240A LOL. At the second occurrence of NSA sub-circuitry and distal from the first odd sense amplifier exit region 241A1, an NSA sub-circuitry is represented within the lower second odd sense amplifier 2409A LO2.

Lower lateral interconnects 199L may each exit the first paired first odd sense amplifier exit region 241A1A and the second paired first odd sense amplifier exit region 241A1B, and each lower lateral interconnect 199L may couple to CS circuitry within the respective lower first and second odd sense amplifiers 240A LO1 and 240A LO2. Upper lateral interconnects 199U may each exit the first paired first odd sense amplifier exit region 241A1A and the second paired first odd sense amplifier exit region 241A1B, and each upper lateral interconnect 199U may couple to CS circuitry within the respective upper first and second odd sense amplifiers 240A UO1 and 240A UO2, which are peripherally clustered with the respective lower first and second odd sense amplifiers 240A LO1 and 240A LO2. In an embodiment, a given lower lateral interconnect 199L may have a shorter composite routing path (shorter length, shorter distance) from a digit line exit region 104 to CS circuitry than the corresponding composite routing path for an upper lateral interconnect 199U to CS circuitry. Even sense amplifiers 240B may also be similarly arranged as the odd sense amplifiers 240A depicted in FIG. 7.

Figure 8:
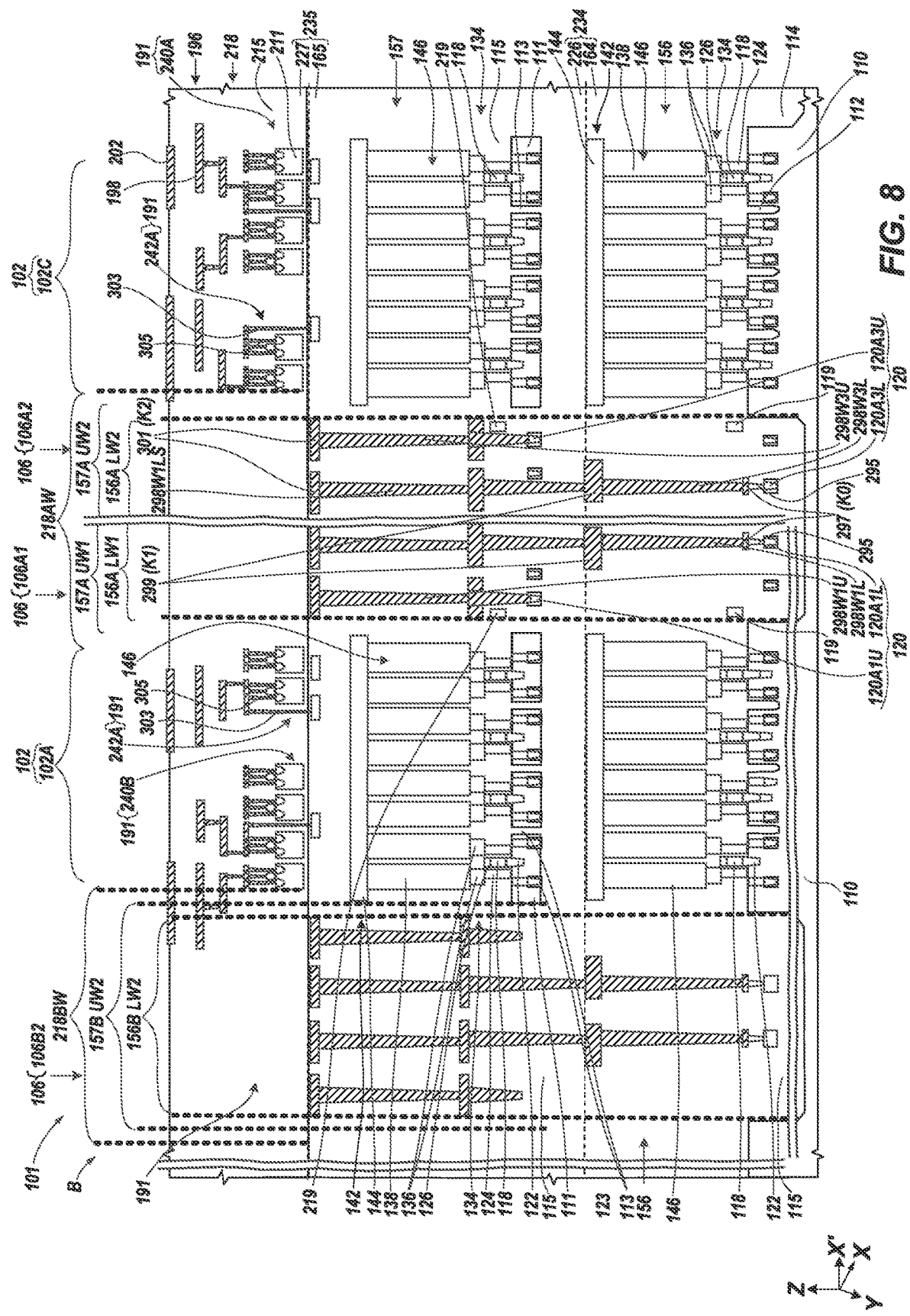
FIG. 8 is a simplified, partial longitudinal cross sectional elevation view of portions of the microelectronic device depicted in FIGS. 1, 2A, 2B, 3, and 4.

FIG. 8 is a simplified, partial longitudinal cross-section elevation view of the microelectronic device 101 that illustrates sub-word line driver (SWD) features of the microelectronic device 101, according to several embodiments. The cross-section view it taken at an angle Y' to the second direction (X-directions) such as about 21 to illustrate both digit lines 118 and word lines 120 in cross section. The third microelectronic device assembly 218 is illustrated with the control logic circuitry 191, SWD sections 242 of the control logic circuitry 191 and SA sections 240 of the control logic circuitry 191. The SWD sections 242 include an odd SWD section 242A within horizontal boundaries of the first array subregion 102A, and another odd SWD section 242A within horizontal boundaries of the third array subregion 102C.

The illustrated view is orthogonal to the view depicted in FIG. 4, and several structures are identically enumerated. The longitudinal cross-section view of the microelectronic device 101 may be taken from the section line B in FIG. 3, where the longitudinal cross-section view includes the first array subregion 102A for both the first microelectronic device assembly 156 and the second microelectronic device assembly 157, the third array subregion 102C also for both the first microelectronic device assembly 156 and the second microelectronic device assembly 157, and portions of the third microelectronic device assembly 218 that are superimposed above the second microelectronic device assembly 157. The longitudinal cross-section view illustrates odd sub-word line drivers 242A in each of the first array subregion 102A and the third array subregion 102C, where the cut-away view bisects the first odd word line exit region 106A1 (FIG. 3) and the second odd word line exit region 106A2 (FIG. 3), where the odd sub-word line drivers 242A appear on opposite sides of the respective first and second odd word line exit regions 106A1 and 106A2, and with the cut-away view, the odd sub-word line driver sections 242A also appear on opposite sides of the odd word line socket region 218AW of the third microelectronic device assembly 218.

Lateral (X-direction) boundaries may be defined at the level of the first microelectronic device assembly 156 and the second microelectronic device assembly 157. Overall for the microelectronic device 101, the odd word line exit region boundaries may be defined by an odd word line socket region 218AW, that is within the third microelectronic device assembly 218 and located between the first array subregion 102A and the third array subregion 102C. Similarly overall for the microelectronic device 101, the even word line exit region boundaries may be defined by an even word line socket region 218BW, that is within the third microelectronic device assembly 218, and adjacent left to the first array subregion 102A.

Further for the first microelectronic device assembly 156 within the odd word line socket region 218AW, the lateral boundaries may include a lower first odd word line socket region 156A LW1 for the first odd word line exit region 106A1 (FIG. 3, between the first array subregion 102A and the third array subregion 102C), and a lower second odd word line socket region 156A LW2 for the second odd word line exit region 106A2 (FIG. 3, between the first array subregion 102A and the third array subregion 102C). The lateral boundaries may be delineated by the base semiconductor material 110 and the dielectric material 114 that fills the lower first odd word line socket region 156A LW1 and the lower second odd word line socket region 156A LW2. Similarly within the odd word line socket region 218AW, lateral boundaries for the second microelectronic device assembly 157 may include an upper first odd word line socket region 156A UW1 for the first odd word line exit region 106A1, and an upper second odd word line socket region 156A UW2 for the second odd word line exit region 106A2. The lateral boundaries may be delineated by the base semiconductor material 111 and the dielectric material 115 that fills the upper first odd word line socket region 156A UW1 and the upper second odd word line socket region 156A UW2.

Further for the first microelectronic device assembly 156 within the even word line socket region 218BW, the lateral (X-direction) boundaries may include a lower second even word line socket region 156B LW2 for the second even word line exit region 106B2 (FIG. 3, adjacent left the first array subregion 102A). The boundaries may be delineated by the base semiconductor material 110 and the dielectric material 114 that fills the lower second even word line socket region 156B LW2. Similarly within the even word line socket region 218BW, lateral boundaries for the second microelectronic device assembly 157 may include an upper second even word line socket region 156B UW2 for the second even word line exit region 106B2. The boundaries may be delineated by the base semiconductor material 111 and the dielectric material 115 that fills the upper second even word line socket region 156B UW2.

Further referring to FIG. 8 for clarity, the first microelectronic device assembly 156 is set forth in some detail at the third array subregion 102C, and the first microelectronic device assembly 156 is set forth more generally at the first array subregion 102A. Similarly, the second microelectronic device assembly 157 is set forth in some detail at the first array subregion 102A, and the second microelectronic device assembly 157 is set forth more generally at the third array subregion 102C.

In an embodiment for the first microelectronic device assembly 156, the first base semiconductor structure 110 is the only semiconductor material in the first microelectronic device assembly 156, such that an open architecture may permit different arrangements of odd word lines 120A (FIG. 2B) enumerated, e.g., 1, 3, 5, 7 . . . (n+1), and even word lines 120B (FIG. 2A), enumerated e.g., 0, 2, 4, 6 . . . n, where odd word lines 120A (FIG. 2B). The odd word lines 120A (FIG. 2B) may extend from two horizontally neighboring array subregions 102 (FIG. 2B) into an odd word line exit region 106A (FIG. 2B). The even word line exit regions 106B (FIG. 2B) may extend from two other horizontally neighboring array subregions 102 (FIG. 2B) into an even word line exit region 106B (FIG. 2B).

Within the word line exit region 106, dummy digit lines 119 for the first microelectronic device assembly 156, and dummy digit lines 219 for the second microelectronic device assembly 157, may, optionally, be located vertically above the word lines 120. If so located, the dummy digit lines 119 and 219 may be located at substantially the same vertical position (e.g., vertical elevation) within the microelectronic device 101 (e.g., within the first base semiconductor structure 110 thereof for the first microelectronic device assembly 156, and within the base structure thereof 111 for the second microelectronic device assembly 157) as the digit lines 118, and may be located to horizontally extend orthogonal to the word lines 120 (e.g., in the Y-direction). A material composition of the dummy digit lines 119 and 219 may be substantially the same as a material composition of the digit lines 118. The dummy digit lines 119 and 219 may be electrically isolated from one another and the other components (e.g., the word lines 120, the digit lines 118) of the microelectronic device 101. The dummy digit lines 119 and 219 (if any) within the word line exit region 106 may not be part of data paths during use and operation of the microelectronic device 101 of the disclosure. In additional embodiments, the dummy digit lines 119 and 219 are absent (e.g., omitted) from the word line exit regions 106. In an embodiment, the dummy digit lines 119 and 219 may be located below the respective redistribution structure pads 299 (K1) and 301 (K2).

As shown in FIG. 8, sub-word line drivers (SWDs) of the SWD sections 242 and conductive structures coupling the word lines 120 to the sub-word line drivers of the SWD sections 242 may be coupled to digit line contacts 298. SWD sections 242 may be proximately paired, with, e.g., a lower odd sub-word line driver 242A LO (FIG. 3) and an upper odd sub-word line driver 242A UO (FIG. 3) that are paired, and paired odd sub-word line drivers 242A may each adjacent the odd word line socket region 281AW.

Within an individual word line exit region 106, conductive routing structure assemblies 297 may include a first redistribution structure pad 297 at a K0 routing level coupled to an individual word line 120 by a first contact 295. The first redistribution structure pad 297 (K0) may be part of a first conductive routing structure assembly coupled to a second conductive routing structure assembly including a second redistribution structure pad 299 (K1), where coupling is at least partially accomplished by a first word line interconnect 298W. In an embodiment, the first redistribution structure pad 297 (K0) is at the same vertical level (Z-direction) as the first routing tier 134, such that the first contact 295 extends between the first odd word line 120A and the first redistribution structure pad 297 (K0), and such that the first contact 295 is vertically taller than illustrated. The first word line interconnect 298W may also be referred to as a first "vertical word line contact" (VWLCON) 298W. The second redistribution structure pad 299 (K1) may be part of a second conductive routing structure assembly located within the second routing tier 142 of the first microelectronic device assembly 156. In addition, the third contact pad (K2) 301 may be part of the third conductive routing structure assembly vertically overlying and coupled to the second redistribution structure pad 299. The third contact pad (K2) 301 may also be coupled to sub-word line driver circuitry within the SWD section 242. The third contact pad (K2) 301 may be part of conductive routing structure assemblies positioned at an interface of the top isolation structure 235 formed from isolation materials 165 of the second microelectronic device assembly 157 and isolation materials 227 of the third microelectronic device assembly 218; and the third contact pad (K2) 301 in the second microelectronic device assembly 157 may be bonded to the third microelectronic device assembly 218. The third contact pad of the third conductive routing structure assembly 301 (K2) may also be referred to as a "top external contact pad 301" (K2) (or top contact pad of the third conductive routing structure assembly 301) as the top contact pad of the third conductive routing structure assembly 301 (K2) may be at the upper boundary of the second microelectronic device assembly 157, and the top contact pad of the third conductive routing structure assembly 301 may be registered, mated and bonded with electrical contacts 303 within the third microelectronic device assembly 218. Similarly, the electrical contacts 303 may also be referred to as bottom contacts 303 (CMOS device bottom contacts 303) of the third microelectronic device assembly 218, where the bottom contacts 303 couple to the third contact pads (K2) 301 at the top isolation structure 235. Still referring to FIG. 8, the conductive routing structure assemblies may include first conductive routing structure assemblies 297 that may include the first redistribution structure pad 297 (K0) within the first microelectronic device assembly 156, second conductive routing structure assemblies 298 that may include the second redistribution structure pad 298 (K1) also within the first microelectronic device assembly 156, and third conductive routing structure assemblies 301 that may include the third redistribution structure pad of the third conductive routing structure assembly 301 (K2) within the second microelectronic device assembly 157.

Still referring to FIG. 8, electrical communication between the word lines 120 and sub-word line driver circuitry within the SWD sections 242 may be further accomplished by sub-word line driver contacts 305 that couples the sub-word line driver circuitry 242 to the CMOS device bottom contacts 303 (K3). In an embodiment, the first and third lower word line interconnects 298W1L and 298W3L are configured with a monolithic (single material, homogeneous characteristic electrically conductive) length (Z-direction) that extends at least between the combined height (Z-direction) of the digit lines 118, the first routing structures 136, and the storage node devices 138 within the first microelectronic device assembly 156. Other electrical structures (e.g., conductive structures) may intervene between the lower word line interconnects, e.g., 298W1L and the subsequent lower digit line contacts 298D1LS. In an embodiment, the first and third upper word line interconnects 298W1U and 298W3U are configured with a monolithic (single material, homogeneous characteristic electrically conductive) length (Z-direction) that extends at least between the storage node devices 138 in the second microelectronic device assembly 157.

Figure 9:
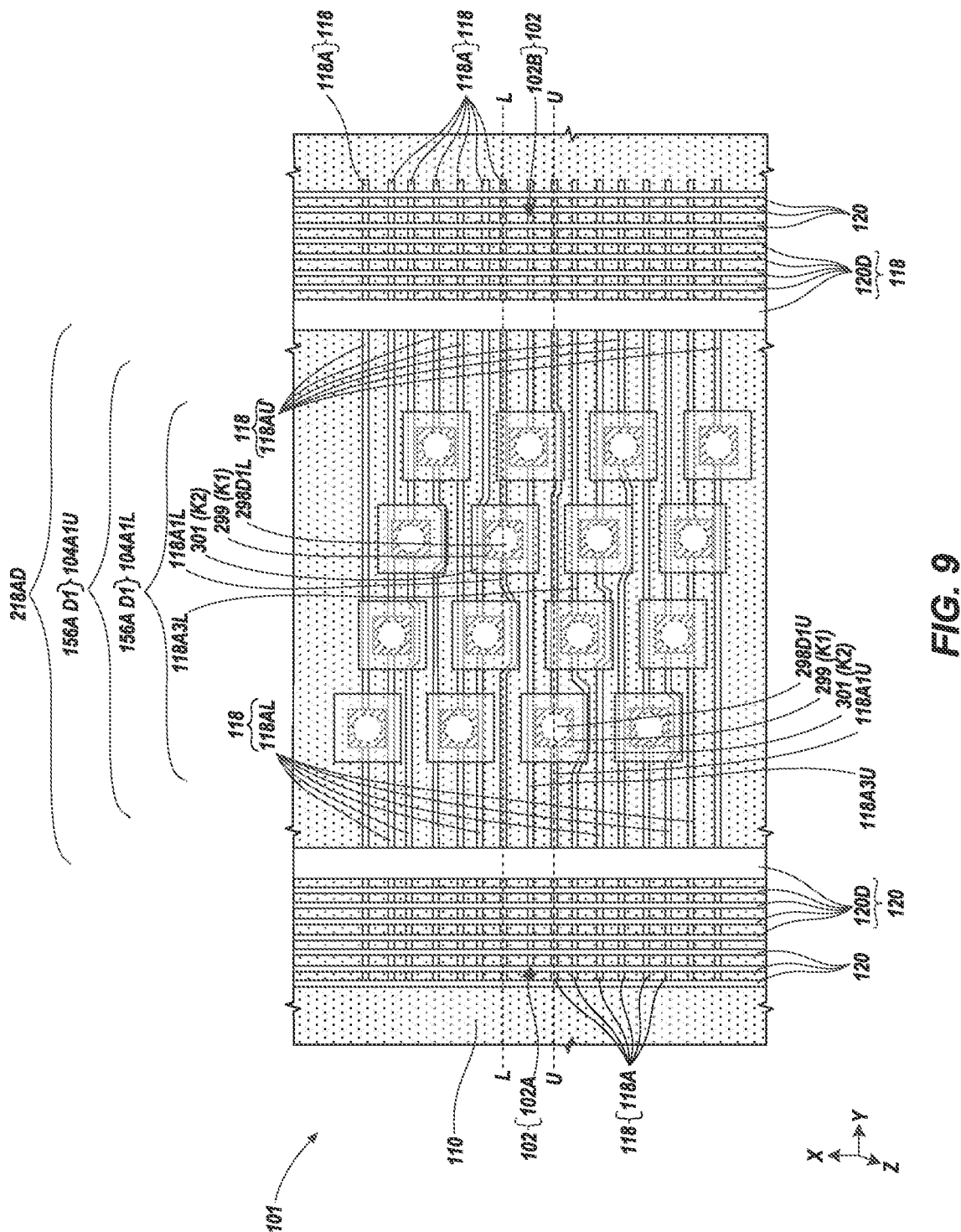
FIG. 9 is a simplified plan view of a portion of the microelectronic device including one of the digit line socket regions that projects downwardly into a digit line exit region according to several embodiments.

FIG. 9 is a simplified plan view of a portion of the microelectronic device 101 including one of the digit line socket regions, such as the odd digit line socket region 218AD depicted in FIG. 4, in accordance with embodiments of the disclosure. The odd digit line socket region 218AD projects downwardly (Z-direction) into a digit line exit region 104 of the second microelectronic device assembly 157 and into a digit line exit region 104 of the first microelectronic device assembly 156. An array of digit line contacts 298 is configured in a "socket out of array" arrangement where all the digit line contacts 298 are fully within given digit line exit regions, such as a lower first odd digit line exit region 104A1L and an first upper odd digit line exit region 104A1U, and the several digit line contacts 298 do not overlie any inactive word lines 120D (also referred to as "dummy word lines" 120D) as discussed further herein. The number of digit line contacts 298 is presented in simplified numbers and arrangements for clarity. Some of the digit lines 118 of the microelectronic device 101 are within the boundaries of one of the digit line exit regions 104, and the associated sense amplifier sections 240 (e.g., FIG. 4) are accessed by the several odd digit lines 118A by the digit line contacts 298 within the digit line exit region 104. Among the several digit lines 118 the first upper odd digit line 118A1U, the first lower odd digit line 118A1L, the third upper odd digit line 118A3U and the third lower odd digit line 118A3L taken from FIG. 4 are highlighted. Several upper odd digit lines 118AU and several lower odd digit lines 118AL are also enumerated. The lower odd digit lines 118AL are seen from the first microelectronic device assembly 156 (e.g., FIG. 4) and the upper odd digit lines 118AU are seen from the second microelectronic device assembly 157 (e.g., FIG. 4). The several digit line contacts 298 have a first population density within the area of the first microelectronic device assembly 156, and the several digit line contacts 298 have a second population density within the area of the second microelectronic device assembly 157 where the second population density may be double the first population density.

The first lower digit line interconnect 298D1L contacts the first lower odd digit line 118A1L. The second redistribution structure pad 299 (K1) contacts the first lower digit line interconnect 298D1L, and the third redistribution layer of the third conductive routing structure assembly 301 (K2), which is illustrated semi-translucently to illustrate directly below located lower structures. The third lower digit line interconnect 298D3L contacts the third lower odd digit line 118A3L. The second redistribution structure pad 299 (K1) contacts the third lower digit line interconnect 298D3L, and the third redistribution layer of the third conductive routing structure assembly 301 (K2), which is illustrated semi-translucently to illustrate directly lower structures.

In an embodiment as illustrated, e.g., the first lower odd digit line 118A1L extends continuously between the first array subregion 102A and the second array subregion 102B. In an embodiment, the first lower odd digit line 118A1L extends only from one of the first array subregion 102A and the second array subregion 102B, such that the first lower odd digit line 118A1L terminates at the lower first digit line interconnect 289D1L. Another lower odd digit line 118AL extends from the other of the first array subregion 102A and the second array subregion 102B, and terminates at a different digit line interconnect 298DL. Such termination configurations may, for example, be employed to provide more space for contacts (e.g., the first contact 295 (FIG. 8) for word lines 120) and conductive routing structure assemblies, such as the redistribution structures (e.g., first redistribution structure pad (K0) 297, FIG. 4) operatively associated with at least some of the odd word lines 120A within the odd word line exit region 106A.

Figure 10:
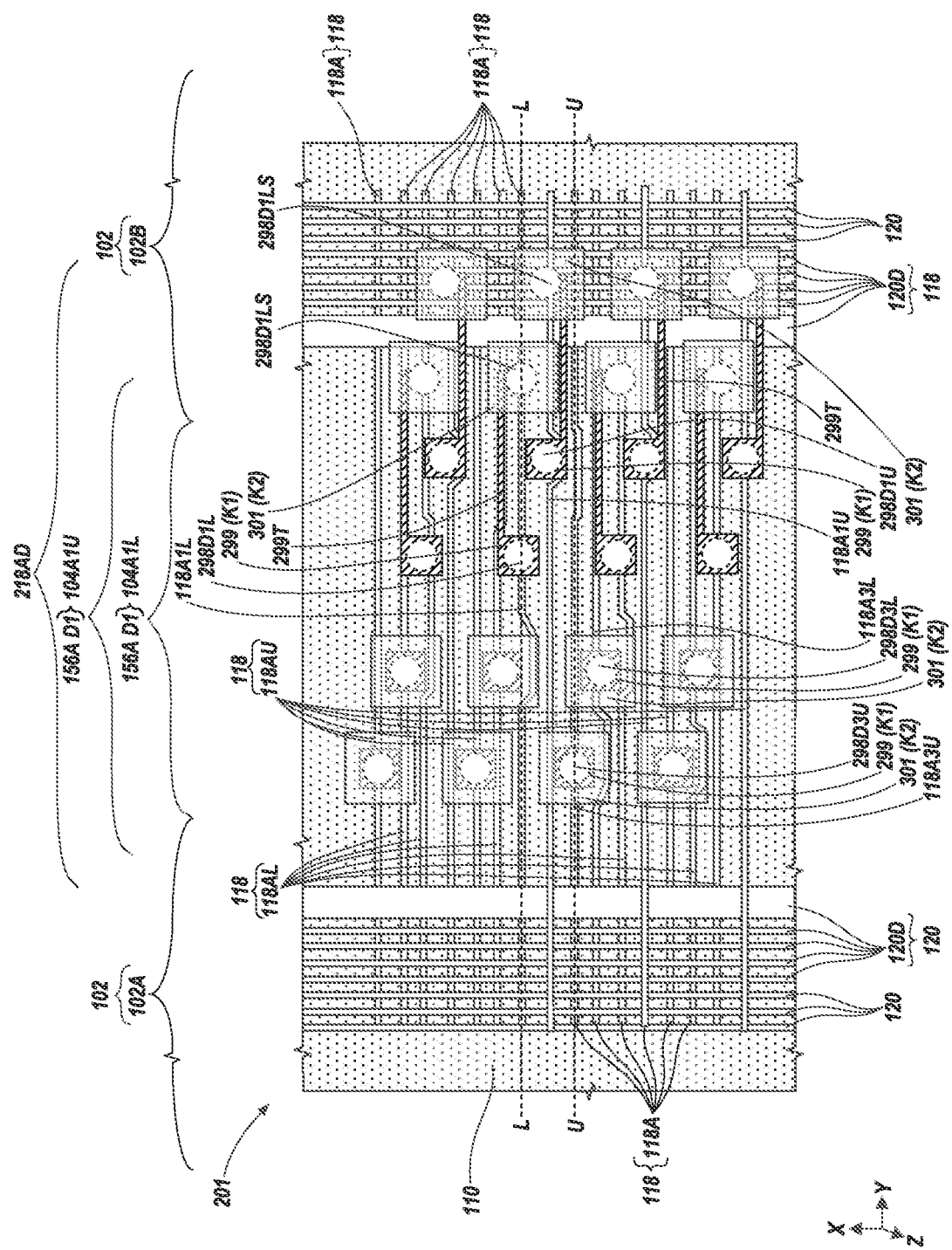
FIG. 10 is a simplified plan view of a portion of another digit line exit region in another embodiment of a microelectronic device, where distribution of some electrical interconnects between digit lines and sense amplifiers are arranged in a halfway distributed configuration.

FIG. 10 is a simplified plan view of a portion of a digit line exit region 104 of a microelectronic device 201, wherein distribution of some electrical interconnects 298 between digit lines 118 and sense amplifiers 240 (FIG. 4) are arranged in a configuration of "halfway distributed," in accordance with additional embodiments of the disclosure. The "halfway distributed" configuration shown in FIG. 10 is different than the "socket out of array" configuration previously described with reference to FIG. 9 (wherein all electrical interconnects or digit line contacts 298 are within the socket area). Similar to the configuration in FIG. 8, one of the digit line socket regions is illustrated, such as the odd digit line socket region 218AD depicted in FIG. 4, and projects downwardly (Z-direction) into a digit line exit region 104 of the second microelectronic device assembly 157 and into a digit line exit region 104 of the first microelectronic device assembly 156 according to several embodiments. An array of digit line contacts 298 is configured in the "halfway distributed" arrangement where half the digit line contacts 298 are fully within a given digit line exit region such as the first lower odd digit line exit region 104A1L or the first upper odd digit line exit region 104A1U (the left illustrated half of digit line contacts), and about half the several digit line contacts 298 at least partially overlie inactive word lines 120D, as discussed further herein. The digit line contacts 298 include upper digit line contacts, e.g., first upper digit line contact 298D1U, lower digit line contacts, e.g., first lower digit line contact 298D1L, and subsequent lower digit line contact 298D1LS (FIGS. 4 and 8). Detail for each of the third upper odd digit line 118A3U and the third lower odd digit line 118A3L, include connection to respective upper and lower digit line contacts 298D3U and 298D3L. Other connections are also illustrated for each of the third upper odd digit line 118A3U and the third lower odd digit line 118A3L, including coupling to the second redistribution structure pad 299 (K1) and to the third redistribution structure of the third conductive routing structure assembly 301 (K3).

Half of the digit line contacts 298 of the microelectronic device 201 may be peripheral to or adjacent to the boundaries of one of the digit line exit regions 104, and the associated sense amplifier sections 240 (e.g., FIG. 4) may be accessed by the several odd digit lines 118A by the digit line contacts 298 peripheral to or adjacent to the boundaries of the digit line exit regions 104. Among the several digit lines 118, the first upper odd digit line 118A1U and the first lower odd digit line 118A1L may be coupled to halfway distributed conductive routing structure assemblies that are peripheral to or adjacent to the illustrated right boundaries of the digit line exit regions 104.

For the first upper odd digit line 118A1U, the second redistribution structure pad 299 (K1) may include a K1 trace portion 299T coupled to the first upper digit line contact 298D1U, where the first upper digit line contact 298D1U and the third redistribution layer contact of the third conductive routing structure assembly 301 (K2) may be at least partially above electrically inactive word lines 120D within the second array subregion 102B. The second redistribution structure pad 299 (K1) may contact the first upper digit line contact 298D1U. The trace portion 299T may extend to and contact the subsequent upper digit line contact 298D1US. The subsequent upper digit line contact 298D1US may contact the third redistribution layer of the third conductive routing structure assembly 301 (K2), which is illustrated semi-translucently to illustrate directly below located lower structures.

Similarly for the first lower odd digit line 118A1L, a first lower digit line contact 298D1L may be coupled to the second redistribution structure pad 299 (K1), and the second redistribution structure pad 299 may include a trace portion 299T coupled to the subsequent lower digit line contact 298D1LS. The subsequent lower digit line contact 298D1LS and the third redistribution layer contact of the third conductive routing structure assembly 301 (K3) may be at least partially above the electrically inactive word lines 120D within the second array subregion 102B. The first lower digit line interconnect 298D1L, may contact the first lower odd digit line 118A1L. The second redistribution structure pad 299 (K1) may contact the first lower digit line interconnect 298D1L. The trace portion 299T may extend to and contact the subsequent lower digit line contact 298D1LS. The subsequent lower digit line contact 298D1LS may contact the third redistribution layer of the third conductive routing structure assembly 301 (K2), which is illustrated semi-translucently to illustrate directly below located lower structures. Contact pads of the third redistribution layer of the third conductive routing structure assembly 301 may be part of conductive routing structure assemblies at the K2 level within the second microelectronic device assembly 157.

Processing of the several structures for the microelectronic device includes forming array regions 102, digit line exit regions 104, word line exit regions 106, access devices 116 and supporting structures, storage node devices 138 and supporting structures, and CMOS devices 218 among other processing. Processing also include joining the first microelectronic device assembly 156 to the second microelectronic device assembly 157, and further joining the "folded memory arrays" of the first microelectronic device assembly 156 and the second microelectronic device assembly 157 to the CMOS device that is part of the third microelectronic device assembly 218.

FIGS. 11A through 11C illustrate simplified, partial longitudinal cross-sectional views of different regions of a microelectronic device precursor structure 100 during assembly to achieve the microelectronic device 101 previously described with reference to FIGS. 1 through 10, in accordance with embodiments of the disclosure. FIG. 11A illustrates a simplified, partial longitudinal cross-sectional view from the perspective of the Y-direction (so as to depict an XZ-plane) of one of the array subregions 102 (e.g., the first array subregion 102A) of microelectronic device 101 shown in FIG. 1. FIG. 11B illustrates a simplified, partial longitudinal cross-sectional view from the perspective of the Y-direction (so as to depict an XZ-plane) of one of the digit line exit regions 104 of the microelectronic device 101 shown in FIG. 1. FIG. 11C illustrates a simplified, partial longitudinal cross-sectional view from the perspective of the X-direction (so as to depict an YZ-plane) of one of the word line exit regions 106 of the microelectronic device 101 shown in FIG. 1.

Referring collectively to FIGS. 11A through 11C, the first microelectronic device precursor structure 100 may be formed to include the first base semiconductor structure 110, filled trenches 112, and a first isolation material 114. The filled trenches 112 vertically extend (e.g., in the Z-direction) into the first base semiconductor structure 110. The first isolation material 114 covers and surrounds surfaces of the first base semiconductor structure 110.

The first base semiconductor structure 110 comprises a base material or construction upon which additional features (e.g., materials, structures, devices) of the microelectronic device precursor structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 114. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. The first isolation material 114 may be formed of and include at least one insulative material. By way of non-limiting example, the first isolation material 114 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 114 is formed of and includes $SiO_x$ (e.g., $SiO_2$). The first isolation material 114 may be substantially homogeneous, or the first isolation material 114 may be heterogeneous. In some embodiments, the first isolation material 114 is substantially homogeneous. In additional embodiments, the first isolation material 114 is heterogeneous. The first isolation material 114 may, for example, be formed of and include a stack of at least two different dielectric materials.

Referring next to FIGS. 12A through 12C, illustrated are simplified, partial longitudinal cross-sectional views, from the directional perspectives previously described, of the array subregion 102 (FIG. 12A), the digit line exit region 104 (FIG. 12B), and the word line exit region 106 (FIG. 12C) at a processing stage of the method of forming the microelectronic device 101 following the processing stage described with reference to FIGS. 11A through 11C. As collectively depicted in FIGS. 12A through 12C, access devices 116 (FIG. 12A) (e.g., access transistors) may be formed within the array subregion 102 (FIG. 12A). In addition, digit lines 118 (FIGS. 12A and 12B) (e.g., data lines, bit lines) may be formed to be coupled to the access devices 116 (FIG. 12A) and to horizontally extend in the Y-direction through the array subregion 102 (FIG. 12A). At least some of the digit lines 118 (FIGS. 12A and 12B) may terminate (e.g., end) within the digit line exit region 104 (FIG. 12B). Furthermore, word lines 120 (e.g., access lines) may be formed to be coupled to the access devices 116 (FIG. 12A) and to horizontally extend in the X-direction through the array subregion 102 (FIG. 3A). At least some of the word lines 120 (FIGS. 12A and 12C) may terminate within the word line exit region 106 (FIG. 12C).

Referring to FIG. 12A, the access devices 116 formed within the array subregion 102 may be employed as components of memory cells (e.g., DRAM cells) to be formed within the array subregion 102. By way of non-limiting example, each access device 116 may individually be formed to include a channel region comprising a portion of the first base semiconductor structure 110; a source region and a drain region each individually comprising one or more of at least one conductively doped portion of the first base semiconductor structure 110 and/or at least one conductive structure formed in, on, or over the first base semiconductor structure 110; and at least one gate structure comprising a portion of at least one of the word lines 120. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extending in parallel in the X-direction orthogonal to the Y-direction. As used herein, the term "parallel" means substantially parallel. The digit lines 118 and the word lines 120 may each individually be formed of and include conductive material. By way of non-limiting example, the digit lines 118 and the word lines 120 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 are each individually formed of and include one or more of W, Ru, Mo, and titanium nitride ($TiN_y$). Each of the digit lines 118 and each of the word lines 120 may individually be substantially homogeneous, or one or more of the digit lines 118 and/or one or more of the word lines 120 may individually be substantially heterogeneous. In some embodiments, each of the digit lines 118 and each of the word lines 120 are formed to be substantially homogeneous.

Still referring to FIG. 12A, within the array subregion 102, additional features (e.g., structures, materials) are also formed on, over, and/or between the access devices 116, the digit lines 118, and the word lines 120. For example, as shown in FIG. 12A, first contact structures 122 (e.g., digit line contact structures, also referred to as so-called "bitcon" structures) may be formed to vertically extend between and couple the access devices 116 to the digit lines 118; second contact structures 124 (e.g., cell contact structures, also referred to as so-called "cellcon" structures) may be formed in contact with the access devices 116 and may configured and positioned to couple the access devices 116 to subsequently formed storage node devices (e.g., capacitors); dielectric cap structures 126 may be formed on or over the digit lines 118; and additional dielectric cap structures 128 may be formed on or over the word lines 120. In addition, dielectric structures (e.g., dielectric spacers, such as low-k dielectric spacers formed of and including one or more low-k dielectric materials) may be formed to intervene (e.g., horizontally intervene) between and isolate the second contact structures 124 and digit lines 118; and further dielectric structures (e.g., gate dielectric structures, such as gate dielectric oxide structures) may be formed to intervene (e.g., horizontally intervene) between and isolate the first contact structures 122 and the word lines 120.

The first contact structures 122 and the second contact structures 124 may individually be formed of and include at least one conductive material. In some embodiments, the first contact structures 122 and the second contact structures 124 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 126 and the additional dielectric cap structures 128 may individually be formed of and include at least one insulative material. In some embodiments, the dielectric cap structures 126 and the additional dielectric cap structures 128 are individually formed of and include a dielectric nitride material (e.g., $SiN_y$, such as $Si_3N_4$).

Referring to FIG. 12B, within the digit line exit region 104, at least some of the digit lines 118 may horizontally terminate (e.g., end) in the Y-direction. Each of the digit lines 118 horizontally extending through the array subregion 102 (FIG. 12A) and horizontally terminating within the digit line exit region 104 may be formed to terminate at substantially the same horizontal position in the Y-direction; or at least one of the digit lines 118 horizontally terminating within the digit line exit region 104 may be formed to terminate at a different horizontal position in the Y-direction within the digit line exit region 104 than at least one other of the digit lines 118 horizontally terminating within the digit line exit region 104. In some embodiments, at least some digit lines 118 horizontally neighboring one another in the X-direction have terminal ends (e.g., terminal surfaces) horizontally offset from one another in the Y-direction. Horizontally offsetting the terminal ends of some of the digit lines 118 from the terminal ends of some other of the digit lines 118 within the digit line exit region 104 may, for example, promote or facilitate desirable contact structure arrangements within the digit line exit region 104.

As shown in FIG. 12B, within the digit line exit region 104, dummy word lines 121 may, optionally, be formed vertically below the digit lines 118. If formed, the dummy word lines 121 may be formed at substantially the same vertical position (e.g., vertical elevation) within the first microelectronic device precursor structure 100 (e.g., within the first base semiconductor structure 110 thereof) as the word lines 120 (FIGS. 12A and 12C), and may be formed to horizontally extend orthogonal to the digit lines 118 (e.g., in the X-direction). A material composition of the dummy word lines 121 may be substantially the same as a material composition of the word lines 120 (FIGS. 12A and 12C). If formed, the dummy word lines 121 may be electrically isolated from one another and the other components (e.g., the word lines 120 (FIGS. 12A and 12C), the digit lines 118) of the first microelectronic device precursor structure 100. The dummy word lines 121 (if any) within the digit line exit region 104 may not be part of data paths during use and operation of a microelectronic device formed through the methods of the disclosure. In additional embodiments, the dummy word lines 121 are absent (e.g., omitted) from the digit line exit region 104.

Referring next to FIG. 12C, within the word line exit region 106, at least some of the word lines 120 may horizontally terminate (e.g., end) in the X-direction. Each of the word lines 120 horizontally extending through the array subregion 102 (FIG. 12A) and horizontally terminating within the word line exit region 106 may be formed to terminate at substantially the same horizontal position in the X-direction; or at least one of the word lines 120 horizontally terminating within the word line exit region 106 may be formed to terminate at a different horizontal position in the X-direction within the word line exit region 106 than at least one other of the word lines 120 horizontally terminating within the word line exit region 106. In some embodiments, at least some word lines 120 horizontally neighboring one another in the Y-direction have terminal ends (e.g., terminal surfaces) horizontally offset from one another in the X-direction. Horizontally offsetting the terminal ends of some of the word lines 120 from the terminal ends of some other of the word lines 120 within the word line exit region 106 may, for example, promote or facilitate desirable contact structure arrangements within the word line exit region 106.

As shown in FIG. 12C, within the word line exit region 106, dummy digit lines 119 may, optionally, be formed vertically above the word lines 120. If formed, the dummy digit lines 119 may be formed at substantially the same vertical position (e.g., vertical elevation) within the first microelectronic device precursor structure 100 (e.g., within the second isolation material 130 thereof) as the digit lines 118 (FIGS. 12A and 12B), and may be formed to horizontally extend orthogonal to the word lines 120 (e.g., in the Y-direction). A material composition of the dummy digit lines 119 may be substantially the same as a material composition of the digit lines 118 (FIGS. 12A and 12B). If formed, the dummy digit lines 119 may be electrically isolated from one another and the other components (e.g., the digit lines 118 (FIGS. 12A and 12B), the word lines 120) of the first microelectronic device precursor structure 100. The dummy digit lines 119 (if any) within the word line exit region 106 may not be part of data paths during use and operation of a microelectronic device formed through the methods of the disclosure. In additional embodiments, the dummy digit lines 119 are absent (e.g., omitted) from the word line exit region 106.

Referring collectively to FIGS. 12A through 12C, the second isolation material 130 may be formed on or over portions of at least the first base semiconductor structure 110, the access devices 116 (FIG. 12A), the digit lines 118 (FIGS. 12A and 12B), the word lines 120 (FIGS. 12A and 12C), the second contact structures 124, and the first isolation material 114. The second isolation material 130 may be formed of and include at least one insulative material. A material composition of second isolation material 130 may be substantially the same as a material composition of the first isolation material 114, or the material composition of the second isolation material 130 may be different than the material composition of the first isolation material 114. In some embodiments, the second isolation material 130 is formed of and includes a dielectric oxide material, such as $SiO_x$ (e.g., $SiO_2$). The second isolation material 130 may be substantially homogeneous, or the second isolation material 130 may be heterogeneous. In some embodiments, the second isolation material 130 is substantially homogeneous. In additional embodiments, the second isolation material 130 is heterogeneous. The second isolation material 130 may, for example, be formed of and include a stack of at least two different dielectric materials.

After assembly of the microelectronic device precursor structure 100 depicted in FIGS. 12A through 12C, further processing includes forming at least some of the first routing structures 136 of the first routing tier 134 (FIGS. 4 and 8), and further coupling the access devices 116 to the storage node devices 138 (e.g., capacitors) to form memory cells 146 (FIGS. 4 and 8) within the array subregion 102. Each memory cell 146 may individually include one of the access devices 116; one of the storage node devices 138; one of the second contact structures 124 interposed between the access device 116 and the storage node device 138; and one of the first routing structures 136 interposed between the second contact structure 124 and the storage node device 138. At least some of the first routing structures 136 within the array subregion 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 116 to accommodate a desired arrangement (e.g., a hexagonal close packed arrangement) of the storage node devices 138 (FIGS. 4 and 8) vertically over and in electrical communication with the access devices 116. At least some of the first routing structures 136 within at least one of the first routing tiers 134 may be coupled to at least some of the first routing structures 136 within at least one other of the first routing tiers 134 by way of conductive interconnect structures.

Referring to again to FIGS. 4 and 8, within the array subregion 102, the storage node devices 138 may individually be formed and configured to store a charge representative of a programmable logic state of the memory cell 146 including the storage node device 138. In some embodiments, the storage node devices 138 comprise capacitors. During use and operation, a charged capacitor may represent a first logic state, such as a logic 1; and an uncharged capacitor may represent a second logic state, such as a logic 0. Each of the storage node devices 138 may, for example, be formed to include a first electrode (e.g., a bottom electrode), a second electrode (e.g., a top electrode), and a dielectric material between the first electrode and the second electrode.

FIG. 13 illustrates a simplified, partial longitudinal cross-sectional view of the array subregion 102 at a processing stage of the method of forming the microelectronic device following the processing stage of FIGS. 12A through 12C, in accordance with embodiments of the disclosure. A microelectronic device precursor structure 200 constituting a portion of the second microelectronic device assembly 157 (FIGS. 4 and 8) may be partially fabricated and bonded to the first microelectronic device assembly 156 (not illustrated in FIG. 13). After fabricating a portion of a second microelectronic device precursor structure 257, fabrication of the second microelectronic device precursor structure 257 is further accomplished, before attaching (e.g., bonding) the second microelectronic device assembly (e.g., the second microelectronic device assembly 157 in FIGS. 4 and 8) to a third microelectronic device assembly, such as the third microelectronic device assembly 218 depicted in part in FIG. 8. A microelectronic device precursor structure 200 may be a portion of the second microelectronic device precursor structure 257 processed before assembling the first routing structures 136 (FIG. 12A) and completing the storage node devices 138 (FIGS. 4 and 8) that are part of the arrays of memory cells 146 for the second microelectronic device assembly 157 (FIGS. 4 and 8). The processing may include mating a carrier wafer 310 to the microelectronic device precursor structure 200 through a sacrificial oxide layer 350, inverting the microelectronic device precursor structure 200, back grinding the base semiconductor structure 110 to form the trench isolation material 113, and then forming the isolation materials 226 (FIGS. 4 and 8) for bonding the second microelectronic device precursor structure 257 to the first microelectronic device assembly 156 (FIGS. 4 and 8). After bonding (e.g., oxide-oxide bonding) the second microelectronic device precursor structure 257 to the first microelectronic device assembly 156, further processing may be effectuated to fabricate the storage node devices 138 (FIGS. 4 and 8) that are part of the arrays of memory cells 146, among other structures of the second microelectronic device assembly 157 (FIGS. 4 and 8). Processing by this embodiment mitigates the risk of damage to the storage node devices 138 that are part of the arrays of memory cells 146 by assembling the storage node devices 138 effectuating the processing conductions (e.g., temperatures) needed to attach (e.g., bond) the first microelectronic device assembly 156 to the second microelectronic device precursor structure 257.

FIG. 14 illustrates a simplified, partial longitudinal cross-sectional view of the array subregion 102 at a processing stage of the method of forming the microelectronic device following the processing stage of FIGS. 12A through 12C, in accordance with embodiments of the disclosure. A third microelectronic device precursor structure 318 may be processed before completion of CMOS devices of the third microelectronic device assembly 218 (FIGS. 4 and 8). After fabricating a portion of the third microelectronic device precursor structure 318, fabrication of the third microelectronic device assembly 218 (FIGS. 4 and 8) is further accomplished, before attaching (e.g., bonding) to the second microelectronic device assembly 157. A microelectronic device precursor structure 300 may be a portion of the third microelectronic device assembly 218 (FIGS. 4 and 8). The illustrated microelectronic device precursor structure 300 of the third microelectronic device assembly 218 may be processed from the third microelectronic device precursor structure 318. The processing may include mating a carrier wafer 410 to the microelectronic device precursor structure 300 through a sacrificial oxide layer 450, inverting the microelectronic device precursor structure 300, back grinding base semiconductor structure 311 to form trench isolation material 315, followed by forming the isolation materials 227 (FIGS. 4 and 8) for bonding the second microelectronic device assembly 157 to the third microelectronic device precursor structure 318 to form the third microelectronic device assembly 218 (FIGS. 4 and 8). After bonding (e.g., oxide-oxide bonding) the third microelectronic device precursor structure 318 to the second microelectronic device assembly 157 (FIGS. 4 and 8), further processing may be accomplished to fabricate back-end-of-line (BEOL) metallization, such as bonding pads 202 (FIGS. 4 and 8), to structures, such as bond pad structures 198 (FIGS. 4 and 8).

Figure 15:
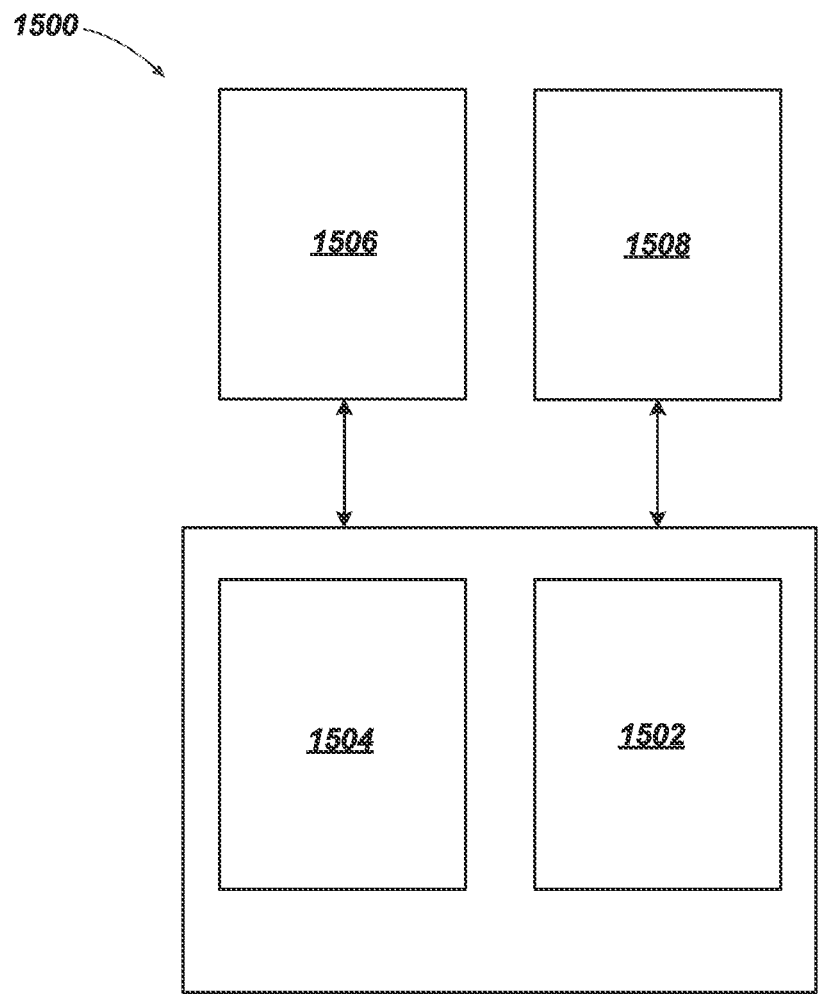
FIG. 15 is a block diagram of an electronic system, according to embodiments of the disclosure.

Microelectronic devices (e.g., the microelectronic device 101) of the disclosure may be used in embodiments of electronic systems of the disclosure. For example, FIG. 15 is a block diagram of an electronic system 1500, according to embodiments of disclosure. The electronic system 1500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 1500 includes at least one memory device 1520. The memory device 1520 may include, for example, one or more of the microelectronic devices (e.g., the microelectronic device 101) of the disclosure. The electronic system 1500 may further include at least one electronic signal processor device 1510 (often referred to as a "microprocessor") that is part of an integrated circuit. The electronic signal processor device 1510 may include, for example, one or more of microelectronic device (e.g., the microelectronic device 101) of the disclosure. While the memory device 1520 and the electronic signal processor device 1510 are depicted as two (2) separate devices in FIG. 15, in additional embodiments, a single (e.g., only one) memory/processor device having the functionalities of the memory device 1520 and the electronic signal processor device 1510 is included in the electronic system 1500. In such embodiments, the memory/processor device may include, for example, one or more of the microelectronic devices (e.g., the microelectronic device 101) of the disclosure. The electronic signal processor device 1510 and the memory device 1520 may be part of a disaggregated-die assembly 1510 and 1520. The disaggregated-die assembly may be coupled among the electronic signal processor device 1510 and the memory device 1520 by an embedded multi-die silicon bridge.

The electronic system 1500 may further include one or more input devices 1530 for inputting information into the electronic system 1500 by a user, such as, for example, a mouse or other pointing device, a keyboard, a touchpad, a button, or a control panel. The electronic system 400 may further include one or more output devices 1540 for outputting information (e.g., visual or audio output) to a user such as, for example, a monitor, a display, a printer, an audio output jack, and/or a speaker. In some embodiments, the input device 430 and the output device 1540 may comprise a single touchscreen device that can be used both to input information to the electronic system 1500 and to output visual information to a user. The input device 1530 and the output device 1540 may communicate electrically with one or more of the memory device 1520 and the electronic signal processor device 1510.

Thus, disclosed is a microelectronic device, comprising a control logic structure including sense amplifiers clustered around sense amplifier exit regions; an upper memory array structure underlying the control logic structure and comprising memory cells coupled to some of the sense amplifiers of the control logic structure by way of routing extending through the sense amplifier exit regions; and a lower memory array structure underlying the upper memory array structure and comprising additional memory cells coupled to some other of the sense amplifiers of the control logic structure by way of additional routing extending through the sense amplifier exit regions.

Also disclosed is a microelectronic device, comprising a first memory array structure comprising: first array regions individually including first memory cells; first digit lines coupled to the first memory cells of the first array regions and extending in a first direction, at least some of the first digit lines terminating within digit line exit regions alternating with the first array regions in the first direction; and first word lines coupled to the first memory cells of the first array regions and extending in a second direction orthogonal to the first direction, at least some of the first word lines terminating within word line exit regions alternating with the first array regions in the second direction; a second memory array structure vertically overlying the first memory array structure and comprising: second array regions individually including second memory cells; second digit lines coupled to the second memory cells of the second array regions and extending in the first direction, at least some of the second digit lines terminating within the digit line exit regions; and second word lines coupled to the second memory cells of the second array regions and extending in the second direction, at least some of the second word lines terminating within the word line exit regions; and a control logic structure vertically overlying the second memory array structure and comprising: first sense amplifiers coupled to the first digit lines; second sense amplifier coupled to the second digit lines; first sub-word line drivers coupled to the first word lines; and second sub-word line drivers coupled to the second world lines.

Also disclosed is an electronic system, comprising: an input device; an output device; a processor device operably coupled to the input device and the output device; and a memory device operably coupled to the processor device and comprising at least one microelectronic device structure comprising: a control logic device structure comprising: sense amplifiers horizontally neighboring sense amplifier exit regions; sub-word line drivers horizontally offset from the sense amplifiers; a first microelectronic device structure vertically underlying the control logic device structure and including memory cells coupled to some of the sense amplifiers by way of conductive structures extending from the some of the memory cells and through the sense amplifier exit regions; and a second microelectronic device structure vertically interposed between the first microelectronic device structure and the control logic device structure, the second microelectronic device structure including additional memory cells coupled to some other of the sense amplifiers by way of additional conductive structures extending from the additional memory cells and through sense amplifier exit regions.

The structures, devices, system, and methods of the disclosure advantageously facilitate one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
   a control logic structure including sense amplifiers clustered around sense amplifier exit regions;
   an upper memory array structure underlying the control logic structure and comprising memory cells coupled to some of the sense amplifiers of the control logic structure by way of routing extending through the sense amplifier exit regions; and
   a lower memory array structure underlying the upper memory array structure and comprising additional memory cells coupled to some other of the sense amplifiers of the control logic structure by way of additional routing extending through the sense amplifier exit regions.

2. The microelectronic device of claim 1, wherein:
   the some other of the sense amplifiers comprise lower sense amplifiers paired adjacent and across the sense amplifier exit regions; and
   the some of the sense amplifiers comprise upper sense amplifiers adjacent the lower sense amplifiers more distal from the sense amplifier exit regions than the lower sense amplifiers.

3. The microelectronic device of claim 2, wherein:
   the upper memory array structure comprises:
      array regions including the memory cells within horizontal areas thereof;
      digit lines coupled to the memory cells and extending in a first direction;
      word lines coupled to the memory cells and extending in a second direction orthogonal to the first direction;
      digit line exit regions horizontally alternating with the array regions in the first direction, the digit lines extending into the digit line exit regions and coupled to the routing by way of first contact structure within the digit line exit regions;
      word line exit regions horizontally alternating with the array regions in the second direction; and
   the lower memory array structure comprises:
      additional array regions including the additional memory cells within horizontal areas thereof;
      additional digit lines coupled to the additional memory cells and extending in the first direction;
      additional word lines coupled to the additional memory cells and extending in the second direction;
      additional digit line exit regions horizontally alternating with the additional array regions in the first direction, the additional digit lines extending into the additional digit line exit regions and coupled to the additional routing by way of second contact structure within the additional digit line exit regions; and
      additional word line exit regions horizontally alternating with the array regions in the second direction.

4. The microelectronic device of claim 2, wherein:
   the sense amplifier exit regions further comprise:
      odd sense amplifier exit regions; and
      even sense amplifier exit regions;
   the lower sense amplifiers comprise:
      lower odd sense amplifiers paired adjacent and across the odd sense amplifier exit regions; and
      lower even sense amplifiers paired adjacent and across the even sense amplifier exit regions; and
   the upper sense amplifiers comprise:
      upper odd sense amplifiers adjacent the lower odd sense amplifiers and spaced from the odd sense amplifier exit regions by the lower odd sense amplifiers; and
      upper even sense amplifiers the lower even sense amplifiers and spaced from the even sense amplifier exit regions by the lower even sense amplifiers.

5. The microelectronic device of claim 4, wherein:
   the lower memory array structure comprises lower odd first digit lines and lower odd third digit lines individually coupled to the lower odd sense amplifiers; and
   the upper memory array structure comprises upper odd first digit lines and upper odd third digit lines individually coupled to the upper odd sense amplifiers.

6. The microelectronic device of claim 5, wherein:
   the lower odd first digit lines, lower odd second digit lines, the lower odd third digit lines, and lower odd fourth digit lines are coupled through contact structures within lower odd first and second digit line exit regions of the lower memory array structure to the lower odd sense amplifiers; and
   the upper odd first digit lines, upper odd second digit lines, the upper odd third digit lines, and upper odd fourth digit lines are coupled through additional contact structures within upper odd first digit line exit regions of the upper memory array structure to the upper odd sense amplifiers.

7. The microelectronic device of claim 6, wherein:
   the lower odd first digit lines and lower odd second digit lines are in a first array subregion;
   the lower odd second digit lines and lower odd fourth digit lines are in a second array subregion;
   the first array subregion and second array subregion are adjacent the lower odd first and second digit line exit regions;
   the upper odd first digit lines and upper odd second digit lines are in a first array subregion;

the upper odd second digit lines and upper odd fourth digit lines are in a second array subregion; and the first array subregion and second array subregion are adjacent the upper odd first and second digit line exit regions.

8. The microelectronic device of claim 2, wherein:

each of the upper memory array structure and the lower memory array structure further comprises array subregions comprising first array subregions, second array subregions, third array subregions, and fourth array subregions;

the first array subregions and the second array subregions are adjacent first and second odd digit line exit regions in a first direction;

the third array subregions and the fourth array subregions are adjacent the first and second odd digit line exit regions in the first direction;

the first array subregions and the third array subregions are adjacent first and second odd word line exit regions in a second direction orthogonal to the first direction; and the second array subregions and the fourth array subregions are adjacent the first and second odd word line exit regions in the second direction.

9. The microelectronic device of claim 8, further comprising:

electrically inactive word lines within the array subregions and horizontally proximate word line exit regions; and digit line redistribution layer contact pads in the upper memory array structure are vertically above and laterally proximate at least some of the electrically inactive word lines.

10. The microelectronic device of claim 8, further comprising:

electrically inactive word lines within the array subregions and horizontally proximate word line exit regions; and digit line redistribution layer contact pads in the upper memory array structure, at least some of the digit line redistribution layer contact pads vertically directly above and laterally proximate at least some of the electrically inactive word lines.

11. The microelectronic device of claim 2, wherein:

each of the upper memory array structure and the lower memory array structure further comprises:

first array subregions, second array subregions, third array subregions, and fourth array subregions;

the first array subregions and the second array subregions are adjacent first and second odd digit line exit regions in a first direction, and wherein the first array subregions and the second array subregions are each adjacent first and second even word line exit regions in a second direction orthogonal to the first direction;

the third array subregions and the fourth array subregions are adjacent first and second odd digit line exit regions in the first direction, and wherein the third array subregions and the fourth array subregions are each adjacent first and second even word line exit regions in the second direction;

the first array subregions and the third array subregions are each adjacent first and second even word line exit regions in the second direction orthogonal to the first direction; and the second array subregions and the fourth array subregions are each adjacent first and second even word line exit regions in the second direction.

12. The microelectronic device of claim 1, wherein the routing couples digit lines coupled to the memory cells of the upper memory array structure to the some of the sense amplifiers of the control logic structure.

13. The microelectronic device of claim 12, wherein:

the additional routing couples additional digit lines coupled to the additional memory cells of the lower memory array structure to the some other of the sense amplifiers of the control logic structure; and path lengths of the routing between the digit lines and the some of the sense amplifiers are shorter than additional path lengths of the additional routing between the additional digit lines and the some other of the sense amplifiers.

14. The microelectronic device of claim 13, wherein the routing and the additional routing individually extend between the sense amplifier exit regions and digit line exit regions horizontally alternating with array regions including the memory cells and the additional memory cells within horizontal areas thereof.

15. The microelectronic device of claim 1, further comprising filled socket openings comprising dielectric material laterally bounded by and adjacent semiconductive material, the fill socket openings comprising:

first filled socket openings within vertical boundaries of the lower memory array structure and individually having a first lateral dimension;

second filled socket openings within vertical boundaries of the upper memory array structure and horizontally overlapping the first fill socket openings, the second filled socket openings individually having a second lateral dimension larger than the first lateral dimension; and third filled socket openings within vertical boundaries of the control logic structure and horizontally overlapping the first fill socket openings and the second filled socket openings, third filled socket openings individually having a third lateral dimension larger than the second lateral dimension.

16. The microelectronic device of claim 15, wherein:

the first filled socket openings further comprise digit line contacts within horizontal areas thereof; and the second filled socket openings further comprise additional digit line contacts within horizontal areas thereof, a quantity of the additional digit line contacts greater than a quantity of the digit line contacts.

17. The microelectronic device of claim 16, wherein:

the digit line contacts physically contact digit lines in electrical communication with the additional memory cells of the lower memory array structure;

some of the additional digit line contacts physically contact the digit line contacts; and some other of the additional digit line contacts physically contact additional digit lines in electrical communication with the memory cells of the upper memory array structure.

18. The microelectronic device of claim 1, wherein the control logic structure further comprises additional control logic devices outside of horizontal areas of the sense amplifiers and comprising complementary metal-oxide-semiconductor (CMOS) circuitry.

19. A microelectronic device, comprising:

a first memory array structure comprising:

first array regions individually including first memory cells;

first digit lines coupled to the first memory cells of the first array regions and extending in a first direction, at least some of the first digit lines terminating within digit line exit regions alternating with the first array regions in the first direction; and first word lines coupled to the first memory cells of the first array regions and extending in a second direction orthogonal to the first direction, at least some of the first word lines terminating within word line exit regions alternating with the first array regions in the second direction;

a second memory array structure vertically overlying the first memory array structure and comprising:

second array regions individually including second memory cells;

second digit lines coupled to the second memory cells of the second array regions and extending in the first direction, at least some of the second digit lines terminating within the digit line exit regions; and second word lines coupled to the second memory cells of the second array regions and extending in the second direction, at least some of the second word lines terminating within the word line exit regions; and a control logic structure vertically overlying the second memory array structure and comprising:

first sense amplifiers coupled to the first digit lines;

second sense amplifiers coupled to the second digit lines;

first sub-word line drivers coupled to the first word lines; and second sub-word line drivers coupled to the second word lines.

20. The microelectronic device of claim 19, wherein:

the first sense amplifiers horizontally neighbor sense amplifier exit regions in the first direction; and the second sense amplifiers horizontally neighbor the first sense amplifiers in the first direction, the first sense amplifiers horizontally interposed between the second sense amplifiers and the sense amplifier exit regions.

21. The microelectronic device of claim 20, further comprising:

first digit lines contact structures within the digit line exit regions and coupled to the first digit lines;

second digit lines contact structures within the digit line exit regions and coupled to the second digit lines;

first routing structures coupled and extending between the first digit lines contact structures and the first sense amplifiers; and second routing structures coupled and extending between the second digit lines contact structures and the second sense amplifiers.

22. The microelectronic device of claim 21, wherein:

the first routing structures horizontally extend between the digit line exit regions and the sense amplifier exit regions; and the second routing structures horizontally extend between the digit line exit regions and the sense amplifier exit regions.

23. An electronic system, comprising:

an input device;

an output device;

a processor device operably coupled to the input device and the output device; and a memory device operably coupled to the processor device and comprising at least one microelectronic device structure comprising:

a control logic device structure comprising:

sense amplifiers horizontally neighboring sense amplifier exit regions; and sub-word line drivers horizontally offset from the sense amplifiers;

a first microelectronic device structure vertically underlying the control logic device structure and including memory cells coupled to some of the sense amplifiers by way of conductive structures extending from some of the memory cells and through the sense amplifier exit regions; and a second microelectronic device structure vertically interposed between the first microelectronic device structure and the control logic device structure, the second microelectronic device structure including additional memory cells coupled to some other of the sense amplifiers by way of additional conductive structures extending from the additional memory cells and through sense amplifier exit regions.

24. The electronic system of claim 23, further comprising:

first dielectric-filled sockets in the first microelectronic device structure and individually having a first lateral dimension;

second dielectric-filled sockets in the second microelectronic device structure and individually having a second lateral dimension larger than the first lateral dimension; and third dielectric-filled sockets in the control logic device structure and individually having a third lateral dimension larger than the second lateral dimension.

25. The electronic system of claim 23, wherein the memory device comprises a DRAM device.

* * * * *